US006855954B1

(12) United States Patent
Zhang

(10) Patent No.: US 6,855,954 B1
(45) Date of Patent: Feb. 15, 2005

(54) THIN FILM TRANSISTOR, FABRICATION METHOD THEREOF AND LIQUID CRYSTAL DISPLAY HAVING THE THIN FILM TRANSISTOR

(75) Inventor: Hong Yong Zhang, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 112 days.

(21) Appl. No.: 09/619,556

(22) Filed: Jul. 19, 2000

(30) Foreign Application Priority Data

Oct. 18, 1999 (JP) .......................................... 11-295677

(51) Int. Cl.⁷ ...................... H01L 31/0376; H01L 31/20
(52) U.S. Cl. ............................. 257/59; 257/57; 257/66; 438/149; 438/151; 438/157
(58) Field of Search ................................. 257/9, 57, 59, 257/66, 67, 72; 438/149, 151, 157, 166, 152, 48, 128, 283

(56) References Cited

U.S. PATENT DOCUMENTS

| | | | | |
|---|---|---|---|---|
| 5,650,636 A | * | 7/1997 | Takemura et al. | 257/59 |
| 5,818,549 A | * | 10/1998 | Maruyama et al. | 349/42 |
| 5,821,133 A | * | 10/1998 | Kawai et al. | 438/30 |
| 5,888,291 A | * | 3/1999 | Chopin et al. | 257/59 |
| 5,889,291 A | * | 3/1999 | Koyama et al. | 257/59 |
| 5,989,945 A | * | 11/1999 | Yudasaka et al. | 438/149 |
| 5,994,717 A | * | 11/1999 | Igarashi et al. | 257/59 |
| 5,995,174 A | * | 11/1999 | Ukita | 349/43 |
| 6,057,896 A | * | 5/2000 | Rho et al. | 349/42 |
| 6,097,038 A | * | 8/2000 | Jinno | 257/57 |
| 6,107,641 A | * | 8/2000 | Mei et al. | 257/66 |
| 6,246,070 B1 | * | 6/2001 | Yamazaki et al. | 257/40 |
| 6,271,540 B1 | * | 8/2001 | Miyamoto et al. | 257/59 |
| 6,271,600 B1 | * | 8/2001 | Inada | 257/784 |
| 6,300,988 B1 | * | 10/2001 | Ishihara et al. | 349/43 |
| 6,359,320 B1 | * | 3/2002 | Yamazaki et al. | 257/408 |
| 6,504,175 B1 | * | 1/2003 | Mei et al. | 257/66 |

FOREIGN PATENT DOCUMENTS

JP         406132536 A  *  5/1994  .................. 257/57

* cited by examiner

*Primary Examiner*—Eddie Lee
*Assistant Examiner*—Douglas W. Owens
(74) *Attorney, Agent, or Firm*—Greer, Burns & Crain, Ltd.

(57) ABSTRACT

The present invention relates to a thin film transistor, a fabrication method thereof and a liquid crystal display having the thin film transistor, and an object of the present invention is to provide a thin film transistor which improves a fabrication yield, a fabrication method thereof and a liquid crystal display having the thin film transistor. In a bottom-gate-type thin film transistor 1 having a gate electrode 4 formed on a substrate, a gate insulating film 6 formed on the gate electrode, an operational semiconductor film 8 formed on the gate insulating film 6 on the gate electrode 4, a channel protection film 3 formed on the operational semiconductor film, and a source and a drain electrodes 14 and 15 formed on both sides of the top surface of the channel protection film 3 connected to the operational semiconductor film with the operational semiconductor, and the channel protection film 3 has a first insulating layer 10 contacting to an upper interface of the operational semiconductor film 8 and a second insulating layer 11 formed on the first insulating layer.

5 Claims, 20 Drawing Sheets display signal (data)

gate scanning signal (n$^{th}$ gate)

BL1 conrol signal (first block)

BL2 conrol signal (second block)

BL3 conrol signal (third block)

BL10 conrol signal (tenth block)

THIN FILM TRANSISTOR, FABRICATION METHOD THEREOF AND LIQUID CRYSTAL DISPLAY HAVING THE THIN FILM TRANSISTOR

BACKGROUND OF THE INVENTION

1. Field of the Invention

The present invention relates to a thin film transistor, a fabrication method thereof and a liquid crystal display having the thin film transistor.

2. Description of the Related Art

One of the switching elements used in an active matrix type liquid crystal display is a thin film transistor (TFT). A structure of the thin film transistor is divided roughly into the so-called bottom-gate-type inverted staggered structure in which a gate electrode is formed on a glass substrate side rather than source and drain electrodes side and the so-called top-gate-type staggered structure or planer-type structure in which the source and the drain electrodes are formed on a glass substrate side rather than a gate electrode. Among these, a bottom-gate-type thin film transistor can be further divided into two structures. One is a structure in which a channel protection film is formed on an operational semiconductor film forming a channel portion and the other is a structure in which a portion of an upper layer of the operational semiconductor film is etched without having the channel protection film.

A cross sectional structure of the conventional bottom-gate-type thin film transistor having the channel protection film is described with reference to FIG. 21. A thin film transistor 100 has a bottom-gate-type gate electrode 104 formed on a glass substrate 102. A gate insulating film 106 made of $SiN_x$ (silicon nitride) is formed on the gate electrode 104 and the glass substrate 100. An operational semiconductor layer 108 made of, for example, amorphous silicon (a-Si:H; hereinafter, simply referred to as a-Si) is formed on the gate insulating film 106, and a channel protection film 110 made of $SiN_x$ is formed on the operational semiconductor layer 108 on the gate electrode 104. An impurity semiconductor layer (ohmic semiconductor layer) 112 and source and drain electrodes 114 and 115 are formed running over opposing edge portions of the channel protection film 110. The deposit from the gate insulating film 106 to the channel protection film 110 are sequentially formed by a plasma CVD method (PCVD method). An interlayer insulating film 116 is formed on the source electrode and the drain electrode 115 and on the channel protection film 110 exposed between the opposing edge portions of the source electrode 114 and the drain electrode and 115. A contact hole is formed on the interlayer insulating film 116 on the source electrode 114 and a pixel electrode 118 formed on the interlayer insulating film 116 is connected with the source electrode 114.

When forming the channel protection film 110 by patterning an inorganic insulating film, a back exposure is performed from the back side of the glass substrate 102 (lower part of FIG. 21). Thus, the channel protection film 110 is self-aligningly formed by using the gate electrode 104 as a mask.

When patterning the source electrode 114 and the drain electrode 115 from a metal layer formed on a whole surface, the source electrode 114 and the drain electrode 115 on the channel protection film 110 are separated taking a mask pattern positioning error in the photolithography process into consideration. Therefore, the source electrode 114 and the drain electrode 115 are structured so that the edge portions thereof respectively have overlapping areas shown by ΔL in the diagram with respect to the gate electrode 104 and face each other by running over the edge portions of the channel protection film 110.

Next, an operational theory of the thin film transistor is briefly described. For example, in the case of a n-type thin film transistor having a $n^+$-type ohmic semiconductor layer 112, a channel area of the operational semiconductor layer 108 is in an "ON" state with a low resistance when a voltage with a positive polarity is applied to the gate electrode 104, and the channel area is in an "OFF" state with a high resistance when a voltage with a negative polarity is applied to the gate electrode 104.

On the other hand, in the case of a p-type thin film transistor having a $p^+$-type ohmic semiconductor layer 112, the channel area is in an "ON" state with a low resistance when a voltage with a negative polarity is applied to the gate electrode 104, and the channel area is in an "OFF" state with a high resistance when a voltage with a positive polarity is applied to the gate electrode 104. Thus, a conduction ("ON") state and cutoff ("OFF") state of a thin film transistor can be controlled by applying a predetermined voltage to the gate electrode 104.

By the way, since the source electrode 114 and the drain electrode 115 overlap (overlapping length: ΔL) on the channel area (or the gate electrode area) in the conventional bottom-gate-type thin film transistor in which the channel protection film 110 is formed as described above, capacitances are formed between the source 114 and the drain electrode 115, the channel protection film 110, and the operational semiconductor film 108, thereby generating undesirable parasitic capacitances ($Cp=(\in_0\in_s/t_s)\times W\times \Delta L$). The parasitic capacitances Cp are in proportion to the inverse number of the overlapping length ΔL, overlapping width W, a relative dielectric constant $\in_s$ of the channel protection film 110, and a film thickness $t_s$ of the channel protection film 110. It will be noted that $\in_0$ is a vacuum dielectric constant.

An active matrix type liquid crystal display using this thin film transistor as a switching element has a problem in which a pixel effective voltage is reduced due to a field-through voltage resulted from the parasitic capacitances Cp, thereby generating a degradation of picture quality such as flickering of the display, a reduction in contrast and the like.

In the separation process of the source electrode 114 and the drain electrode 115 by patterning a metal layer on the channel protection film 110, a slit is formed on the channel protection film ($SiN_x$ film) 10 by using an RIE (reactive ion etching). Therefore, permanent damages such as a trap level in a film and the like due to ion bombardment are generated to an $SiN_x$ film of the channel protection film 110, and a possibility of a reduction in electric characteristics or a long-term reliability of the thin film transistor exists, thereby resulting in an obstacle for improving a fabrication yield.

SUMMARY OF THE INVENTION

An object of the present invention is to provide a thin film transistor which is a bottom-gate-type thin film transistor in which a channel protection film is formed, suppresses the parasitic capacitances, and improves the fabrication yield, and to provide a fabrication method thereof and a liquid crystal display having the thin film transistor.

The above object can be achieved by a bottom gate type thin film transistor comprising a gate electrode formed on a substrate, a gate insulating film formed on the gate electrode, an operational semiconductor film formed on the gate insulating film on the gate electrode, a channel protection film formed on the operational semiconductor film, a source and a drain electrodes formed on both sides of a top surface of the channel protection film and connected to the operational semiconductor film, wherein the channel protection film comprises a first insulating layer contacting to an upper interface of the operational semiconductor film and a second insulating film formed on the first insulating layer.

DESCRIPTION OF THE PREFERRED EMBODIMENTS

Figure 1A:
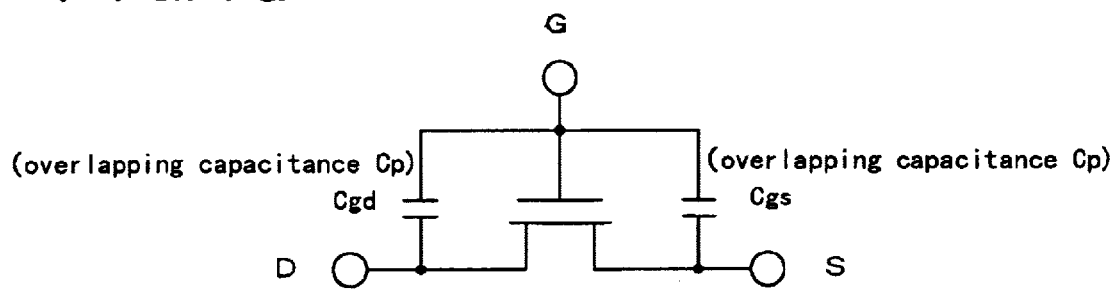
FIG. 1a through FIG. 1c are diagrams showing schematic structures of a thin film transistor according to an embodiment of the present invention.
Figure 1B:
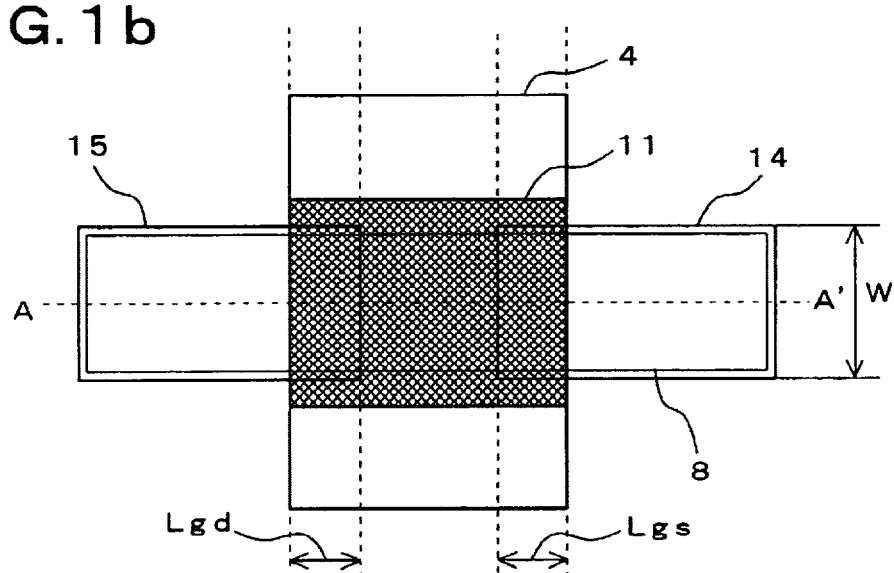
Figure 1C:
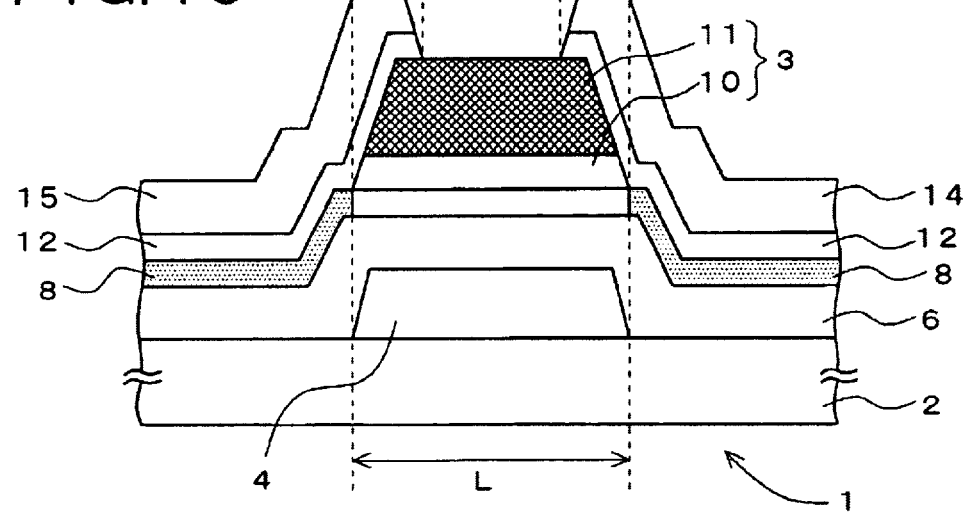

A thin film transistor, a fabrication method thereof and a liquid crystal display having the thin film transistor according to an embodiment of the present invention are described with reference to FIG. 1a through FIG. 20. First, a basic structure of the thin film transistor according to this embodiment is described with reference to FIG. 1a through FIG. 1c. FIG. 1a through FIG. 1c show a bottom-gate-type thin film transistor having a channel protection film according to this embodiment. FIG. 1a shows an equivalent circuit of this thin film transistor, FIG. 1b is a plan view of this thin film transistor and FIG. 1c is a cross sectional view of the FIG. 1b cut at a line A–A'.

A thin film transistor 1 has a bottom-type gate electrode 4 made of a Cr thin film equal to, for example, 150 nm in thickness formed on a glass substrate 2. A gate insulating film 6 made of $SiN_x$ equal to, for example, approximately 350 nm in thickness is formed on the gate electrode 4 and the glass substrate 1. An operational semiconductor layer 8 made of a-Si equal to, for example, approximately 30 nm in thickness is formed on the gate insulating film 6, a first insulating layer 10 made of $SiN_x$ equal to approximately 200 nm in thickness is formed on the operational semiconductor layer 8 on the gate electrode 4. A second insulating layer 11 is formed on the first insulating layer 10. The second insulting layer 11 is formed by laminating an insulating film of an organic resin such as acrylic resin, polyimide resin, or the like, or an inorganic insulating film such as $SiN_x$, $SiO_x$ or the like at approximately 1.5 μm in thickness. A channel protection film 3 having a two-layer structure is structured with the first insulating layer 10 and the second insulating layer 11.

A formation material for the second insulating layer 11 is selected so that a relative dielectric constant $\in_2$ of this second insulating layer 11 is approximately the same as or smaller than a relative dielectric constant $\in_1$ of the first insulating layer 10. Further, the film thickness $t_2$ of the second insulating layer 11 is formed to be approximately the same as or thicker (for example, more than twice) than the film thickness $t_1$ of the first insulating layer 10. Furthermore, the second insulating layer 11 is formed into approximately the same pattern as the first insulating layer 10 on the first insulating layer 10.

An impurity semiconductor layer (ohmic semiconductor layer) 12, a source electrode 14 and a drain electrode 15 are formed on this second insulating layer 11 by running over opposing edge portions. The gate insulation film 6 through the second insulating layer 11 are sequentially deposited by a PCVD method.

As shown in the diagram, with respect to the channel length L, edge portions of the source electrode 14 and the drain electrode 15 are respectively structured to have overlapping portions indicated by Lgs and Lgd in the diagram and to face each other by running over the second insulating layer 11. Therefore, as shown in FIG. 1a, a parasitic capacitance Cgs between a gate (G) and a source (S) is expressed by an overlapping capacitance Cp=($\in_o\in_s/t_s$)×W× Lgs. Here, W is a channel width. On the other hand, a parasitic capacitance Cgd between the gate (G) and a drain (D) is expressed by an overlapping capacitance Cp=($\in_o\in_s/t_s$)×W× Lgd.

In the structure described above, the thin film transistor 1 according to this embodiment has a distinctive characteristic that the channel protection film 3 is the two-layer structure. More specifically, while the conventional channel protection film is a single-layer inorganic film, this channel protection film 3 is structured by a two-layer insulating film composed of the first insulating layer 10 of an inorganic lower-layer insulating film and the second insulating layer 11 of an organic upper-layer insulating film.

By using the inorganic lower-layer insulating film including an $SiN_x$ film in this manner, a bedding a-Si layer is not damaged when forming a film, and further a preferable adhesiveness with the a-Si layer which is the bedding layer can be obtained. On the other hand, by using the organic upper-layer insulating film, an inorganic insulating film in which deposition of a thick film is difficult is not required and at the same time a thick film which is lower than that of the inorganic insulation film in relative dielectric constant can be easily formed. Therefore, the channel protection film having such the two-layer structure is easily fabricated and has a merit in cost. It will be noted that the inorganic upper-layer insulation film may be further formed after an inorganic insulating film which is superior in matching with a bedding layer is deposited. In that case, a material for an inorganic upper-layer insulating film which is as small as possible in relative dielectric constant than that of the lower-layer insulating film and is easy to be formed as thick as possible is required to be selected.

Each of the parasitic capacitances Cp between the source and the gate and between the drain and the gate can be particularly reduced by laminating the first insulating layer 10 of the inorganic lower-layer insulating film and the second insulating layer 11 of the organic upper-layer insulating film having a lower relative dielectric constant and a thicker film than those of the first insulating layers 10 in this order as the first insulating layers 10 and 11.

As a result, a field-through voltage due to the parasitic capacitance Cp can be reduced. When the thin film transistor according to this embodiment is fused as a switching element of a liquid crystal display, a reduction of pixel effective voltage is improved, thereby preventing flickering of the display, a reduction in contrast and the like. Further, by providing the thick organic insulating film (the second insulating layer 11) at the upper layer of the first insulation on layer 10 as a spacer, at the time of an RIE during the separation process of the source electrode 14 and the drain electrode 15, plasma damage due to an ion bombardment is not given to an $SiN_x$ film surface of the first insulating layer 10, thereby improving electric characteristics or a long-term reliability of the thin film transistor and further improving a fabrication yield. This embodiment is described with reference to specific examples below.

EXAMPLE 1

Example 1 is an example of applying this embodiment to a thin film transistor in which a-Si is used for an operational semiconductor film. First, a fabrication process of this thin film transistor is described with reference to FIG. 2a through FIG. 4b.

Figure 2A:
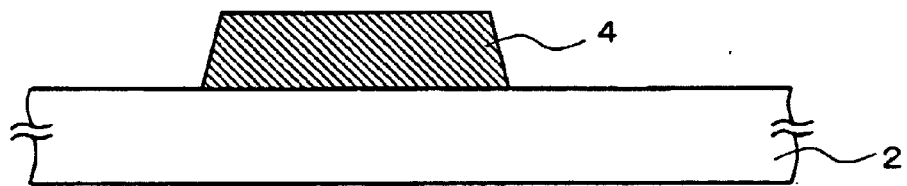
FIG. 2a through FIG. 2d are diagrams describing Example 1 in a fabrication process of a thin film transistor according to an embodiment of the present invention.

As shown in FIG. 2a, a glass substrate 2 of, for example, Corning Corporation #1737 is used as an insulative substrate. A chrome (Cr) thin film is deposited from 100 to 300 nm in film thickness, preferably to 150 nm on the glass substrate 2 by sputtering. It will be noted that tantalum (Ta), molybdenum (Mo), aluminum (Al) alloy and the like can also be used in place of Cr. Next, a resist is coated on a whole surface by the usual photolithography process, patterned, and then the Cr thin film is etched by a wet etching with the use of a resist pattern as a mask to form the gate electrode 4.

Figure 2B:
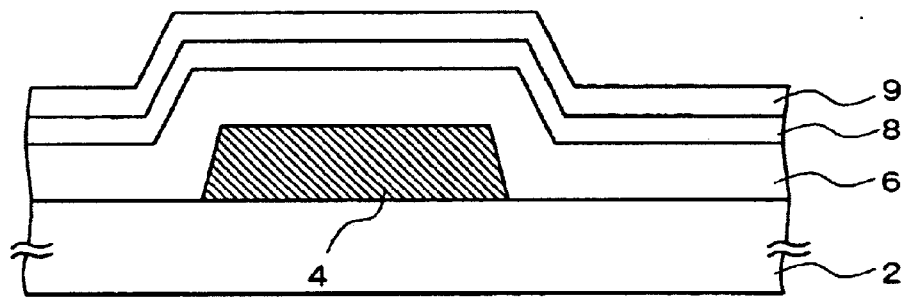

Then, as shown in FIG. 2b, the gate insulating film 6 is formed by depositing, for example, an $SiN_x$ film from 200 to 500 nm in thickness, preferably to approximately 350 nm, using the PECVD method. Next, the a-Si film 8 for forming an operational semiconductor film is formed from 20 to 100 nm in thickness, preferably to approximately 30 nm. Next, an insulating film 9 in which, for example, an $SiN_x$ film is formed from 100 to 300 nm, preferably to 200 nm in thickness, is formed in order to form the first insulating layer 10. Deposition from the gate insulating film 6 through the insulating film 9 is sequentially performed by the PECVD method.

Figure 2C:
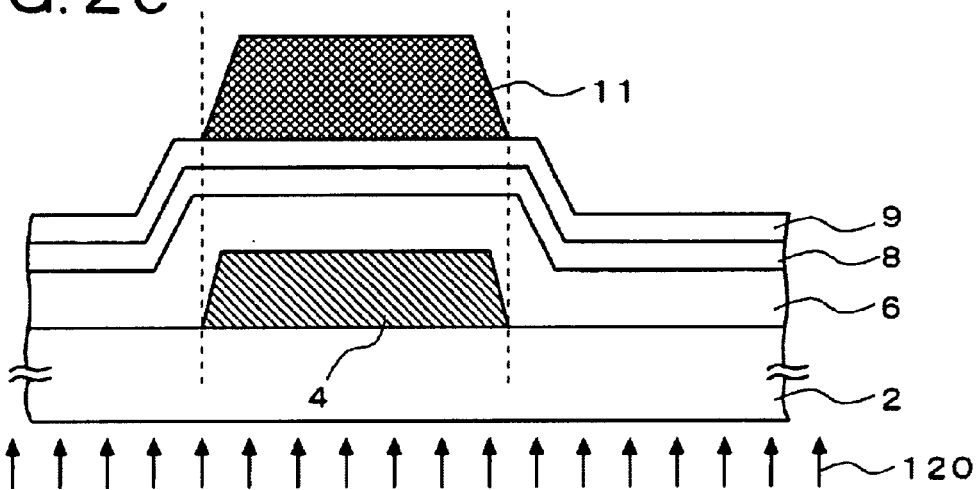

Then, as shown in FIG. 2c, a positive-type photoresist equal to 1.0 to 2.5 $\mu$m in thickness, preferably equal to 1.5 $\mu$m, is coated on a whole surface, and after a pre-bake process, a pattern for the second insulating layer is formed by combining a back exposure and a front exposure. A residual resist area is self-alignigly obtained along the gate electrode 4 by a back exposure 120, and then the second insulating layer 11 is formed by removing photoresist other than the desired area along the gate electrode 4 by the photolithography process from the front. A photosensitive organic film (polyimide, acrylic, etc.) can also be used in place of the resist.

Figure 2D:
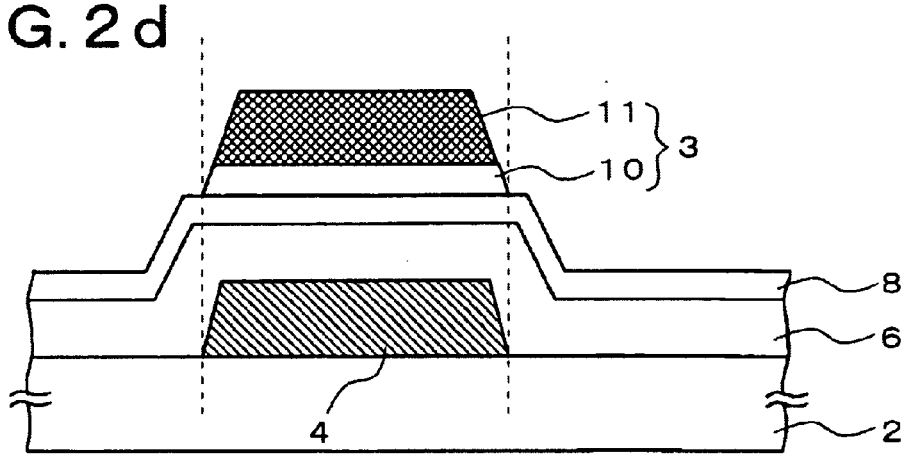

Next, as shown in FIG. 2d, a post-bake is performed at a temperature between 150 to 250° C., preferably at approximately 180° C. and the first insulating layer 10 is formed by selectively dry-etching the $SiN_x$ insulating film 9 on the a-Si film 8 by the RIE, thereby forming the channel protection film 3 of the two-layer structure of the first insulating layer 10 and the second insulating layer 11.

Figure 3A:
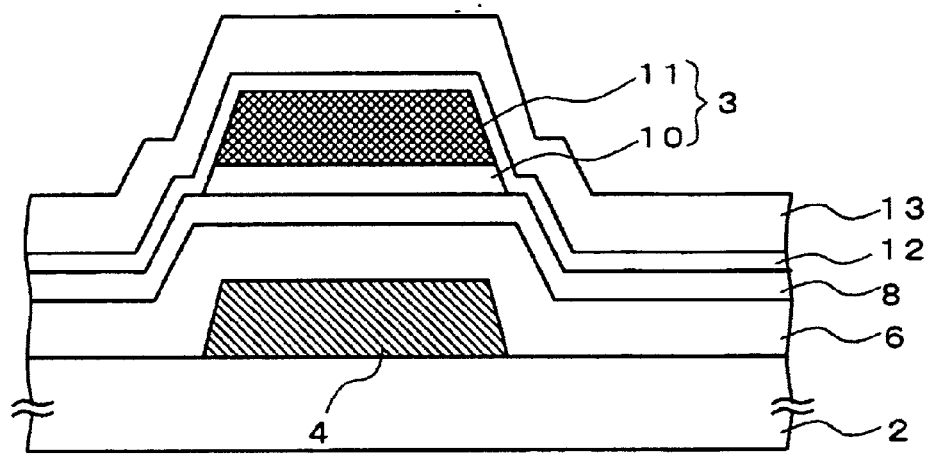
FIG. 3a through FIG. 3c are diagrams describing Example 1 in a fabrication process of a thin film transistor according to an embodiment of the present invention.

Then, as shown in FIG. 3a, an n$^+$ impurity semiconductor layer 12 is formed from 10 to 50 nm in film thickness, preferably to approximately 30 nm, by using the PECVD method and then a Ti/Al-Si/Ti layer (film thickness 100/200/100 nm) 13 for forming a source electrode layer and a drain electrode layer is formed by sputtering.

Figure 3B:
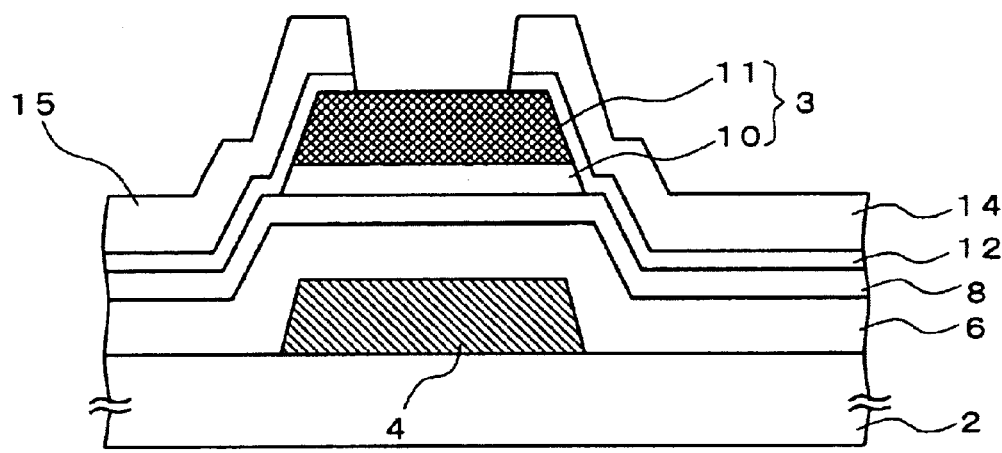

Next, as shown in FIG. 3b, the source electrode 14 and the drain electrode 15 are formed by etching the Ti/Al-Si/Ti layer 13 and the n$^+$ impurity semiconductor layer 12 by the RIE using chlorine-type gas. At this time, the second insulating layer 11 which is the resist film functions as an etching stopper.

Figure 3C:
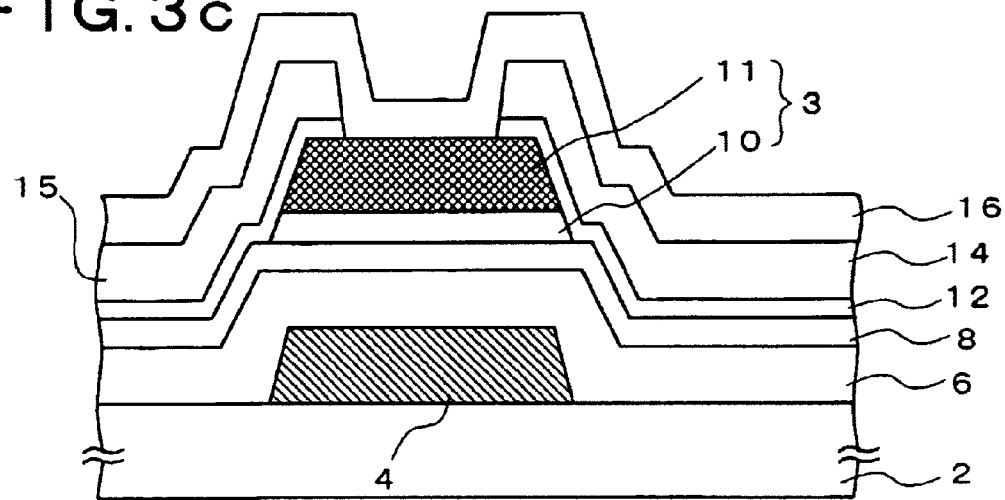

Then, as shown in FIG. 3c, an $SiN_x$ interlayer insulating film 16 equal to 100 to 500 nm in thickness, preferably equal to approximately 300 nm, is deposited by the PECVD method.

Figure 4A:
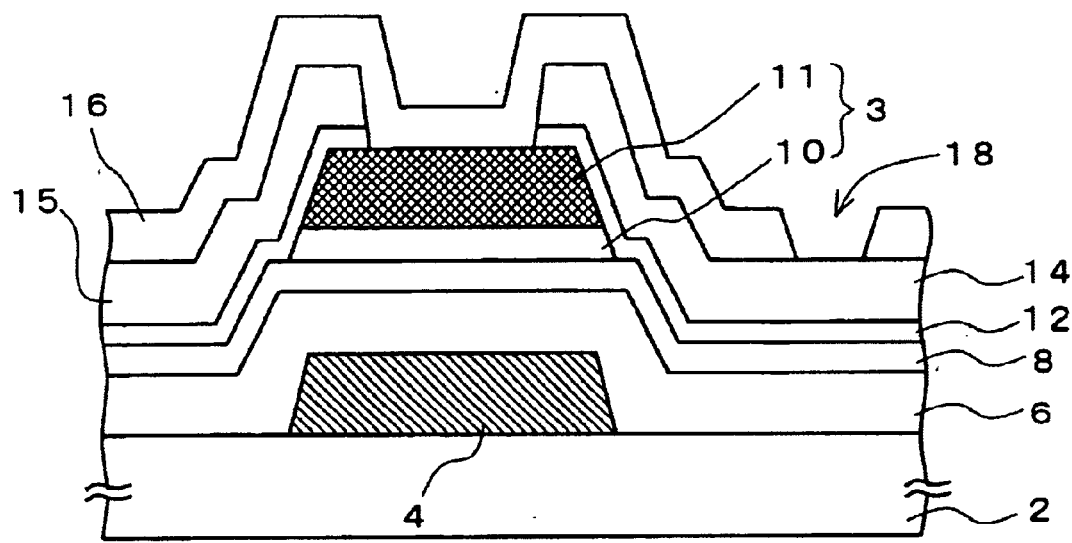
FIG. 4a and FIG. 4b are diagrams describing Example 1 in a fabrication process of a thin film transistor according to an embodiment of the present invention.

Next, as shown in FIG. 4a, a contact hole 18 is formed on the interlayer insulating film 16 on the source electrode 14 by the usual photolithography process and the RIE process.

Figure 4B:
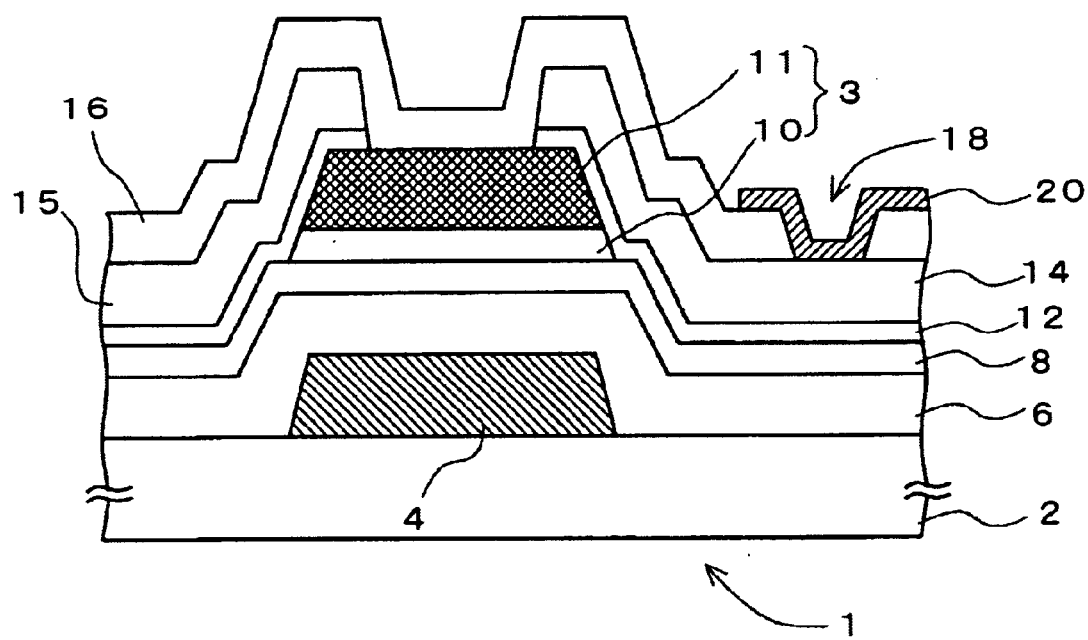

Next, as shown in FIG. 4b, an ITO (indium tin oxide) film which is a transparent electrode is developed from 50 to 100 nm in thickness, preferably to approximately 70 nm, by sputtering. Then, a pixel electrode 20 is formed by patterning the ITO film using the usual photolithography process and the wet etching process. Then, an anneal treatment is performed for 60 minutes in the $N_2$ environment of 200 to 300° C. and a fabrication process of an array substrate completes.

Figure 5A:
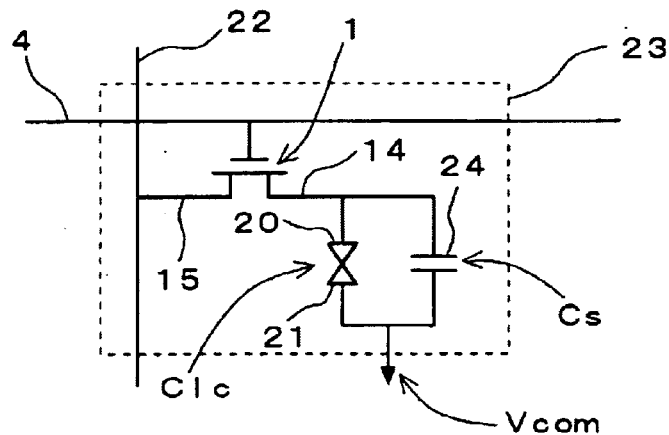
FIG. 5a and FIG. 5b are diagrams describing Example 1 for an array substrate of a liquid crystal display panel fabricated by using a fabrication method of a thin film transistor according to an embodiment of the present invention.
Figure 5B:
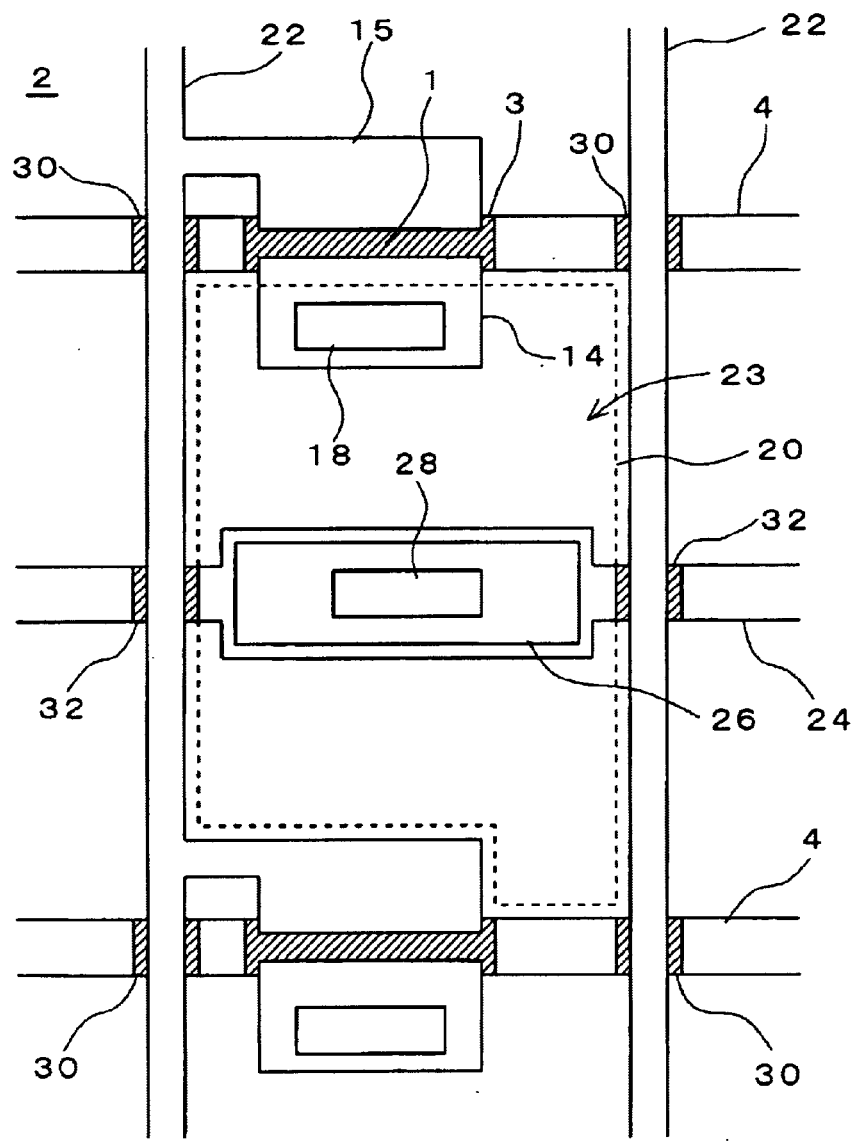

FIG. 5a and FIG. 5b show a schematic structure of an array substrate of the liquid crystal display panel fabricated by using the fabrication method of a thin film transistor according to this example. FIG. 5a shows an equivalent circuit of the liquid crystal display according to this example and FIG. 5b shows a schematic structure of one pixel portion viewing an array substrate to the substrate surface. As shown in FIG. 5a, the liquid crystal display according to this example is not different from the conventional liquid crystal display as far as the equivalent circuit is concerned. In other words, a pixel area 23 is formed in an area decided by a plurality of gate wirings 4 and a plurality of data wirings 22 orthogonal to the gate wiring 4. The thin film transistor 1 is formed in the pixel area 23, a gate electrode of the pixel area 23 is connected to the gate wiring 4, the drain electrode 15 is connected to a data electrode 22 and the source electrode 14 is connected to a pixel electrode 20. A liquid crystal capacitance Clc is formed by a liquid crystal sandwiched between the pixel electrode 20 and a common electrode 21 formed on an opposite substrate side which is not shown in the diagram, and a storage capacitance Cs is formed by a storage capacitor wiring 24 which will be described with reference to FIG. 5b later.

Next, as described with reference to FIG. 5b as well as FIG. 5a, the plurality of gate wirings 4 are formed on the glass substrate 2. Further, the plurality of data wirings 22 are formed in the direction orthogonal to the gate wirings 4. The thin film transistor 1 is formed in the pixel area 23 decided by the gate wiring 4 and the data wiring 22. As shown in FIG. 5b, the gate electrode of the thin film transistor 1 according to this embodiment is not formed by being pulled out of the gate wiring 4, but a part of the linearly wired gate wiring 4 is structured to be used as the gate electrode. Further, as also evident from the FIG. 5b, overlapping areas are inevitably formed between areas where the opposing gate and source electrodes 14 and 15 run over the edge portions of the second insulating layer 11 on the first insulating layer 10 and the gate electrode 4 when viewed from the direction of the plan view.

The pixel electrode 20 (shown by a dashed line in the diagram) connected with the source electrode 14 of the thin film transistor 1 via the contact hole 18 is formed in the pixel area 23. Further, a storage capacitor wiring 24 is formed crossing the pixel area 23 in parallel with the gate wiring 4. Furthermore, an opposing storage capacitor electrode 26 is formed in each of the pixel area 23 via the storage capacitor wiring 24 and the gate insulating film 6 (not shown in FIG. 5a and FIG. 5b), and this storage capacitor electrode 26 is connected with the pixel electrode 20 via a contact hole 28.

Also, a resin spacer film 30 simultaneously formed at the time of patterning for forming the second insulating layer 11 is formed at an intersecting portion of the gate wiring 4 and the data wiring 22. Further, a resin spacer film 32 simultaneously formed at the time of patterning for forming the second insulating layer 11 is also formed at an intersecting portion of the storage capacitor wiring 24 and the data wiring 22. A wiring capacitance of the intersecting wiring portions can be reduced by these resin spacer films 30 and 32.

Next, a parasitic capacitance Cp on the Cgs side is described to show the remarkable reduction of the parasitic capacitance Cp (Cgs and Cgd) of the thin film transistor formed according to this example comparing with the conventional parasitic capacitance. Assuming a parasitic capacitance formed in the first insulating layer 10 is C1 and a parasitic capacitance formed in the second insulating layer 11 is C2, since these capacitances are regarded as a serial connection:

$$Cp=C1 \cdot C2/(C1+C2) \quad \text{Formula (1)}$$

Further, based on the above formula to find an overlapping capacitance Cp:

$$C1=(\epsilon_0\epsilon_1/t_1) \times W \times Lgs \quad \text{Formula (2)}$$

$$C2=(\epsilon_0\epsilon_2/t_2) \times W \times Lgs \quad \text{Formula (3)}$$

Here, assuming Lgs=2 µm, W=30 nm, the film thickness of the first insulating layer 10 is 200 nm (relative dielectric constant is 7.0), the film thickness of the second insulating layer 11 is 105 µm (relative dielectric constant is 3.2), and when these values are substituted in the formulas (2) and (3) and the results are substituted in the formula (1) to calculate, the overlapping parasitic capacitance Cp (between the gate and source sides) is Cp=1.04 fF. Similarly, when the overlapping parasitic capacitance Cp of the conventional thin film transistor forming only the first insulating layer 10 is calculated as Cp=18.6 fF, thereby confirming a remarkable reduction of the Cp by this example. It will be noted that the Cp can also be substantially reduced in a similar manner between the gate and the drain side.

As a result, when the pixel capacitance (liquid crystal capacitance Clc and storage capacitance Cs) is 600 fF and a gate voltage is 25V, the field-through voltage which has been equal to approximately 752 mV in the past can be substantially reduced to approximately 46 mV. Further, since a parasitic capacitance at the intersecting portion of the gate wiring and the data wiring can be similarly reduced, load on driving elements driving the gate wirings and the data wirings can be also remarkably reduced.

Next, an example of a variation of the liquid crystal display shown in this Example 1 is described with reference to FIG. 6a through FIG. 7. Fabrication processes of the liquid crystal display according to this variation example are the same as the processes shown with reference to FIG. 2a through FIG. 2d, and FIG. 3a and FIG. 3b among the fabrication processes described with reference to FIG. 2a through FIG. 4b in this Example 1. Therefore, the characteristic points are described with reference to FIG. 6a through FIG. 6c replacing FIG. 3c, FIG. 4a and FIG. 4;b. It will be noted that the same structuring elements as in Example 1 are referred by the same codes and the descriptions are omitted.

Figure 6A:
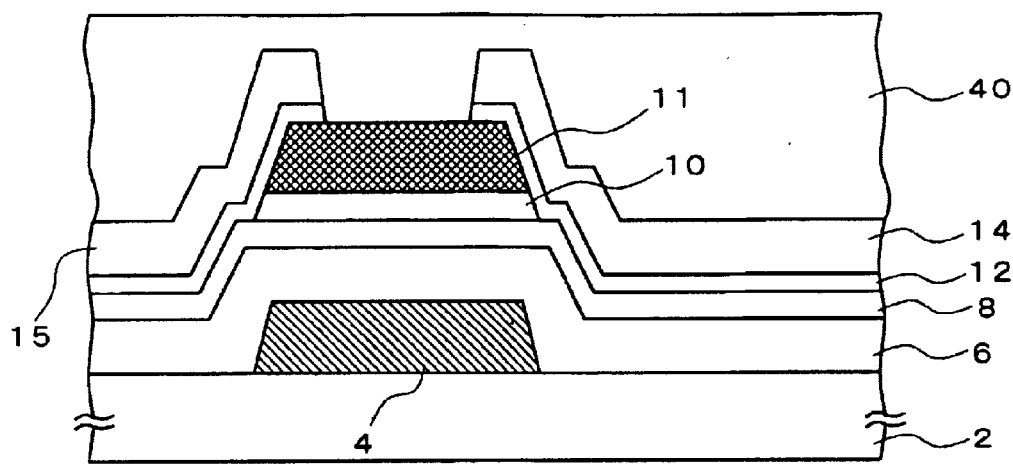
FIG. 6a through FIG. 6c are diagrams describing an example of a variation of Example 1 for a liquid crystal display according to an embodiment of the present invention.

First, as shown in FIG. 6a, the gate electrode 4 is formed on the glass substrate 2 and the gate insulating film 6 is formed on the glass substrate 2 and the gate electrode 4. The operational semiconductor layer 8 where a channel is formed is formed on an upper layer of the gate insulating film 6 on the gate electrode 4, and the first insulating layer 10 is formed on an upper layer of the channel forming layer. The second insulating layer 11 is formed on the first insulating layer 10. Then, an ohmic contact layer 12, the source electrode 14 and the drain electrode 15 are formed on an upper portion of the second insulating layer 11, facing each other by running over the edge portions. A resin-type planarized film is used instead of the $SiN_x$ film in Example 1 as an interlayer insulating film 40 formed on a whole surface. Specifically, an acrylic resin equal to 1.0 to 5.0 µm in thickness, preferably equal to approximately 2 µm, is coated on the substrate as the interlayer insulating film 40. Polyimid can be used as the resin-type planarized film, besides the acrylic-type resin. Further, although an OSG is of a resin type, the OSG also can certainly be used as the planarized film.

Figure 6B:
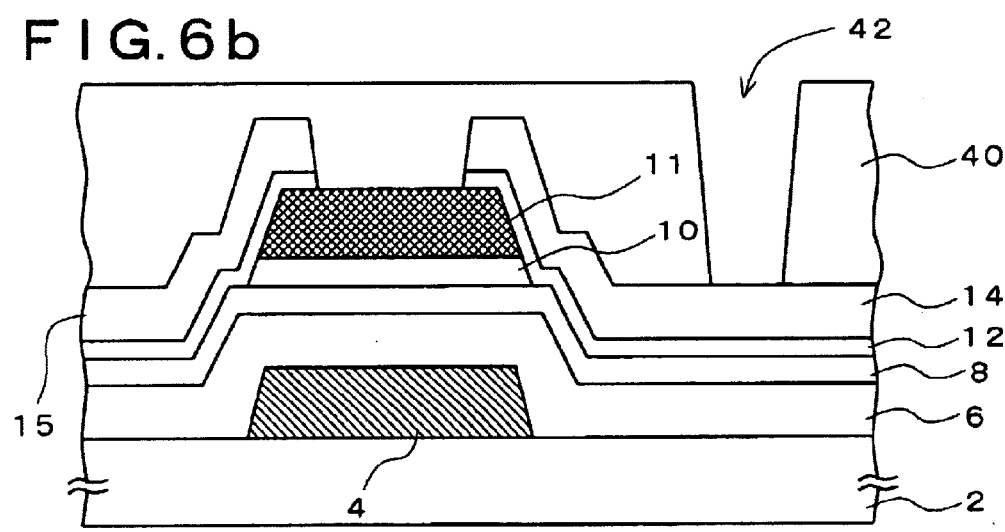

Next, as shown in FIG. 6b, a contact hole 42 is formed on the source electrode 14 by the usual photolithography process and the RIE process. It will be noted that when a photosensitive resin material is used for the planarized film, the resist coating in the photolithography process and the RIE process are not required.

Figure 6C:
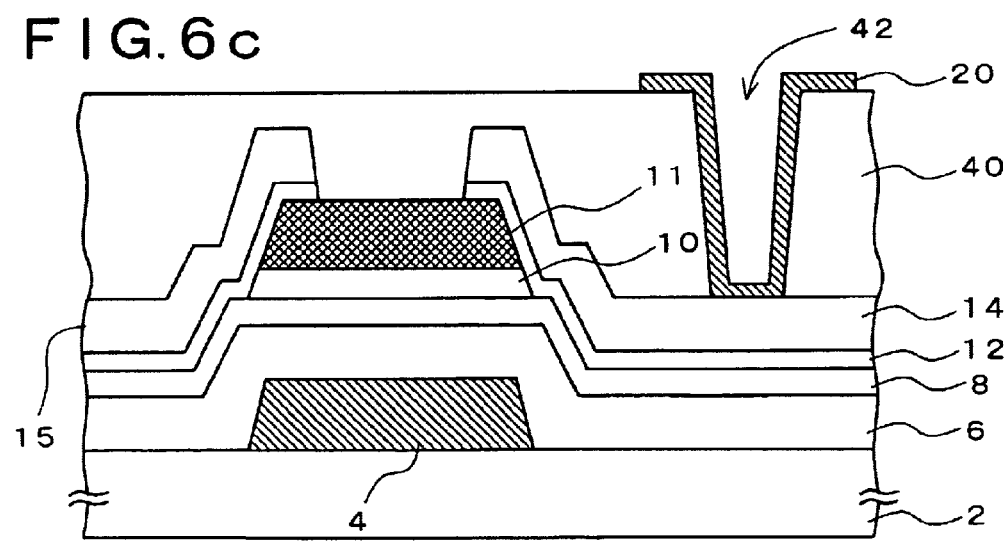

Next, as shown in FIG. 6c, the pixel electrode 20 is formed by the usual photolithography process and the wet etching process after depositing the ITO film equal to 50 to 100 nm in thickness, preferably equal to 70 nm. Then, the anneal treatment is performed for approximately 60 minutes in the $N_2$ environment of 200 to 300° C. and the fabrication process of the TFT substrate is completed.

A plan view of the pixel of the liquid crystal display panel formed by using the processes shown in FIG. 6a through FIG. 6c is described with reference to FIG. 7. Since the interlayer insulating film of this liquid crystal display panel is thick, any problem of wiring capacity will not occur even if the edge portions of a display electrode 20 are overlapped on the gate wiring 4 and the data wiring 22. Thus, as shown in the diagram, an aperture ratio can be remarkably improved by using the gate wiring 4 and the data wiring 22 on the TFT substrate side as a BM (in other words, "BM on TFT" structure) instead of the BM (black matrix) layer (shading layer) ordinarily formed on the opposite substrate side, and by overlapping the edge portions of the display electrode 20 on the gate wiring 4 and the data wiring 22 deciding the pixel area.

Figure 7:
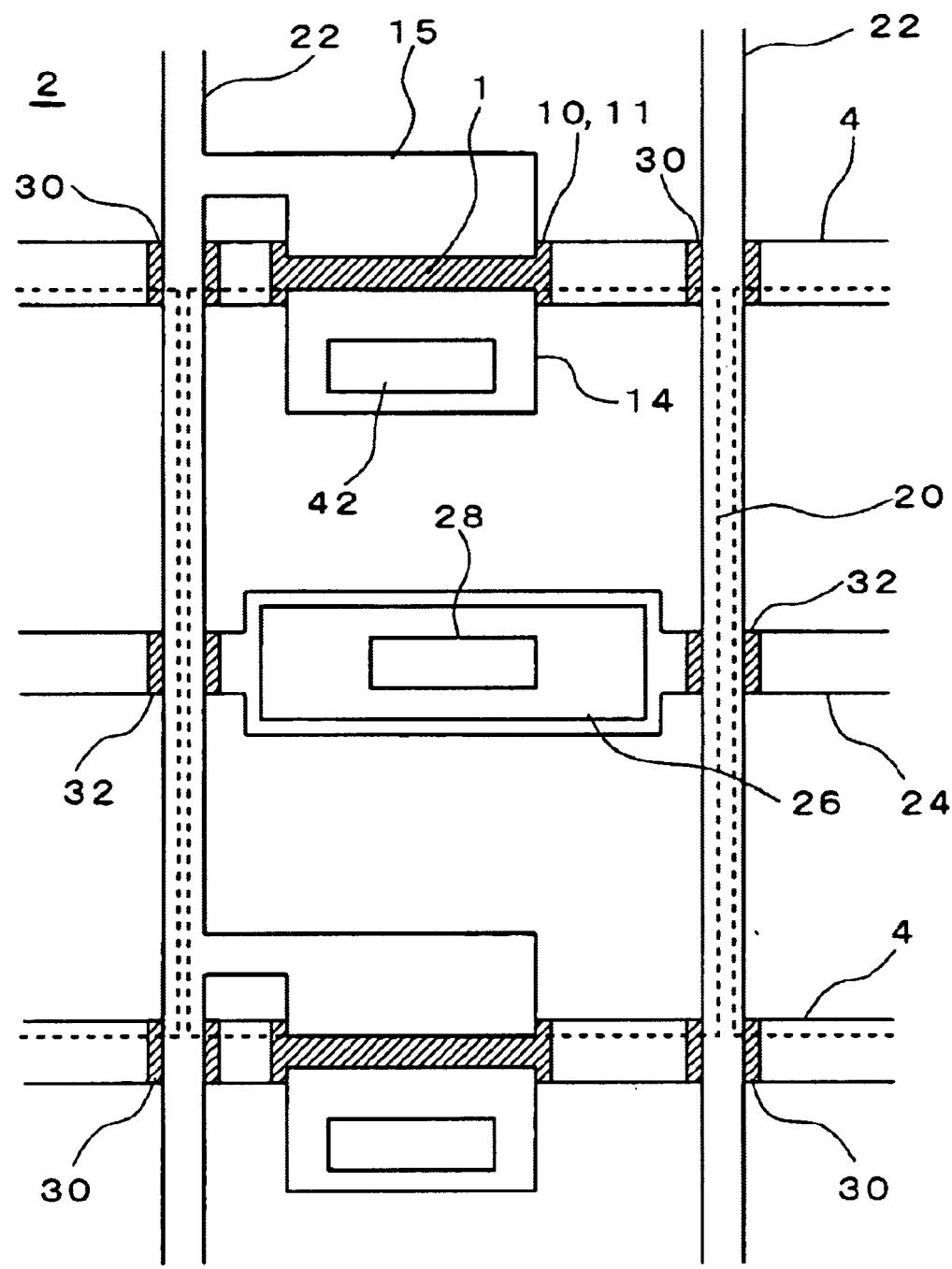
FIG. 7 is a diagram describing an example of a variation of Example 1 for a liquid crystal display according to an embodiment of the present invention.

The variation example shown in FIG. 6a through FIG. 7 can also be applied to a reflection-type liquid crystal display panel. If the display electrode 20 made of the transparent electrode material such as the ITO and the like shown in FIG. 6a through FIG. 6c and the like is changed to a reflection-type electrode using Al (aluminum) and the like, the reflection-type liquid crystal display panel can be fabricated by substantially the same processes as the above fabrication processes.

Figure 8:
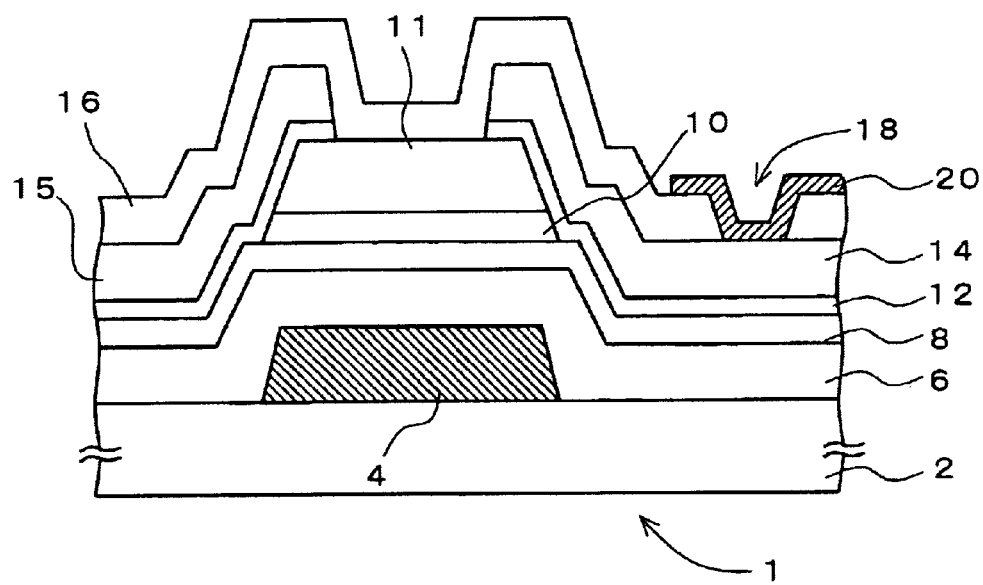
FIG. 8 is a diagram describing an example of another variation of Example 1 for a liquid crystal display according to an embodiment of the present invention.

Next, an example of other variation of the liquid crystal display shown in this Example 1 is described with reference to FIG. 8. It will be noted that the same structuring elements as in Example 1 are referred by the same codes and the descriptions are omitted. While in Example 1, the second insulating layer 11 of the organic upper-layer insulating film is formed on the first insulating layer 10 of $SiN_x$, the liquid crystal display according to this variation example has a distinctive characteristic in forming the second insulating layer 11 using a $SiO_2$ film as the inorganic upper-layer insulating film instead of the organic upper-layer insulating film.

Since the relative dielectric constant of a $SiO_2$ film is as low as 3.8 to 4.2 in comparison with the relative dielectric constant of 7 to 9 of an $SiN_x$ film, a thick $SiO_2$ film (film thickness is approximately 1.0 to 1.5 $\mu$m) of the inorganic upper-layer insulating film can be used instead of an organic upper-layer insulating film. The channel protection film 3 having the two-layer structure can be formed by sequentially depositing $SiN_x$ and $SiO_2$ films by the PECVD method in the fabrication process of the liquid crystal display according to this variation example, thereby simplifying the fabrication process. Although an illustration is omitted, after the resist pattern is formed on the channel in the photolithography process combining the back exposure and the front exposure, an undesirable $SiO_2$ film is removed by the wet-etching and then an undesirable $SiN_x$ film is removed by the dry-etching. After the resist is peeled, the $n^+$ semiconductor film is deposited and then a metal layer for forming the source electrode and the drain electrode is formed. Since subsequent fabrication processes are the same as the processes after FIG. 3a in Example 1, the descriptions are omitted. It will be noted that forming the channel protection film by the two-layer inorganic insulation substance is not limited to the PECVD method. For example, a head CVD method, sputtering or SOG can certainly be used. Further, although the channel protection film can be structured, in theory, only by a thick $SiO_2$ film instead of the $SiN_x$ and $SiO_2$ films having the two-layer structure, when conditions such as the adhesiveness with the bedding a-Si, sequential depositions of a-Si by the PECVD method and the like are considered, structuring the channel protection film only by the thick $SiO_2$ film generates various difficulties and is not practical.

EXAMPLE 2

Example 2 is an example applying this embodiment to a low-temperature polysilicon thin film transistor (p-SiTFT) having an LDD (light doping drain) structure. Degradation of TFT characteristics due to a hot carrier injection can be prevented by providing an LDD area having a high resistance between a channel and a source and drain area having a low resistance.

Figure 9A:
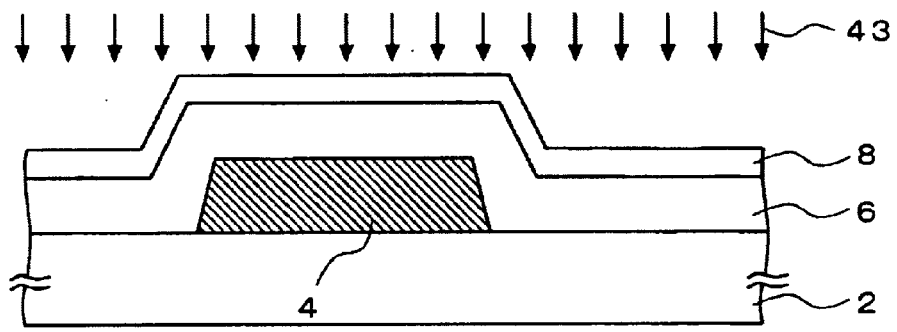
FIG. 9a through FIG. 9d are diagrams describing Example 2 in a fabrication process of a thin film transistor according to an embodiment of the present invention.

First, the fabrication process of this thin film transistor is described with reference to FIG. 9a through FIG. 12b. As shown in FIG. 9a, for example, the glass substrate 2 by Coming Corporation #1737 is used as the insulative substrate. A Cr thin film is deposited on the glass substrate 2 by sputtering until the film thickness is equal to 100 to 300 nm, preferably equal to 150 nm. It will be noted that Ta, Mo, Al alloy or the like can also be used instead of Cr. Next, the gate electrode 4 is formed by coating the resist on a whole surface by the usual photolithography process, patterning the resist, etching the Cr thin film by the wet-etching using the resist pattern as a mask. Then, using the PECVD method, for example, an $SiN_x$ film is deposited from 200 to 500 nm in thickness, preferably to approximately 350 nm, and the gate insulating film 6 is formed. Then, by using the PECVD method, an a-Si:H film 8 equal to 20 to 100 nm in thickness, preferably equal to approximately 40 to 50 nm is formed for forming an operational semiconductor film. Then, a hydrogen removing process in which hydrogen is discharged from the a-Si film 8 is performed by performing the anneal treatment for approximately one hour in the $N_2$ environment of 450° C. Then, the a-Si film 8 is altered to a polysilicon (p-Si) film 45 by irradiating an eximer laser beam 43 having a wavelength equal to 308 nm and an energy density equal to 300 to 400 $mJ/cm^2$, preferably equal to 320 to 350 $mJ/cm^2$, to the a-Si film 8. It will be noted that the above anneal process is not required when an a-Si film having low hydrogen density is used.

Figure 9B:
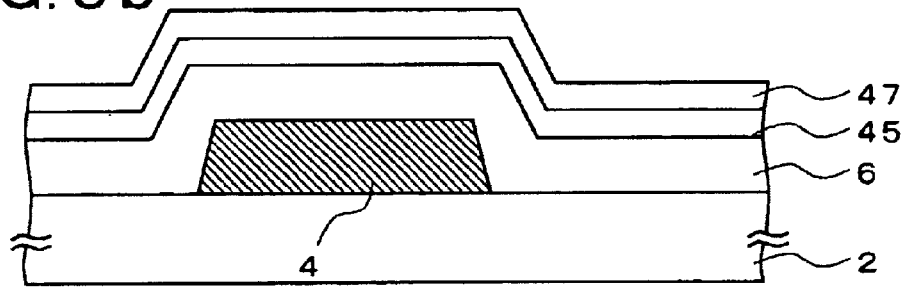

Next, as shown in FIG. 9b, an insulating film 47 which is, for example, an $SiN_x$ film formed to be equal to 100 to 200 nm in thickness, preferably equal to 150 nm, is deposited in order to form the first insulating layer 10 to be the first layer of the channel protection film. This insulating film 47 is formed to be thinner than the film of the $SiN_x$ film 9 in Example 1 due to the LDD area doping.

Figure 9C:
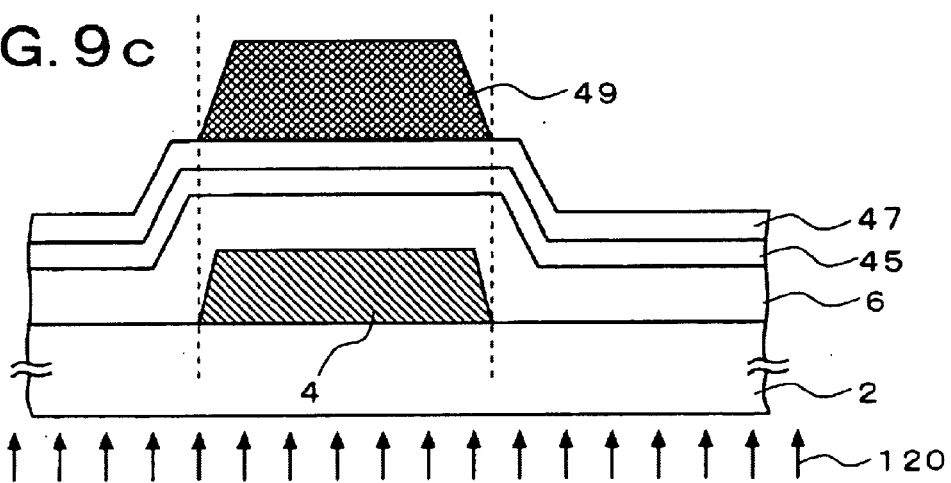

Next, as shown in FIG. 9c, a positive-type photoresist equal to 1.0 to 2.5 $\mu$m in thickness, preferably equal to 1.5 $\mu$m, is coated on a whole surface, and after the pre-bake process, the insulating layer pattern 49 is formed by combining a back exposure and a front exposure. By the back exposure 120, a residual resist area is self-aligningly obtained along the gate electrode 4, and then photoresist other than the desired area along the gate electrode 4 is removed by the photolithography process from the front, and an insulating layer 49 is formed. Instead of the resist, a photosensitive organic film (polyimide, acrylic, and the like) can also be used.

Figure 9D:
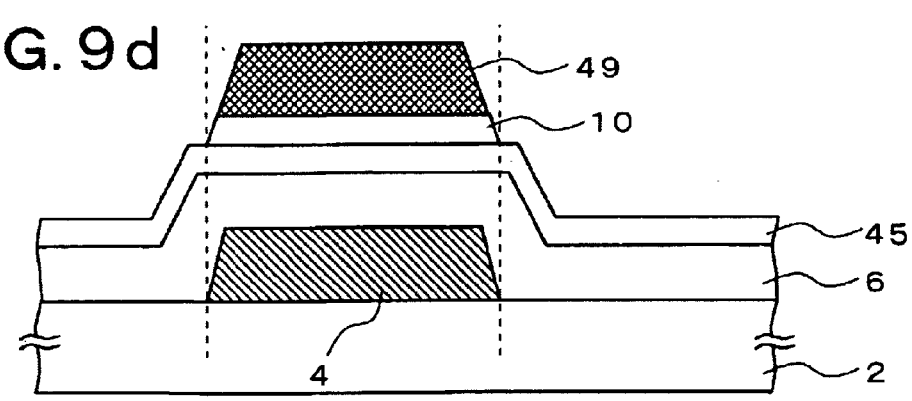

Then, as shown in FIG. 9d, the post-bake is performed at the temperature of 150 to 250° C., preferably approximately 180° C., the SiNx film 47 on the p-Si film 45 is selectively dry-etched by the RIE using the insulating layer 49 as a mask, and the first insulating layer 10 is formed.

Figure 10A:
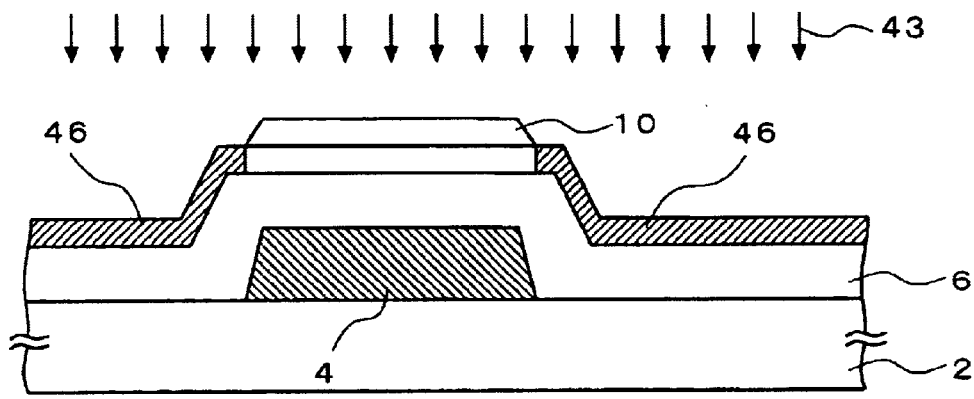
FIG. 10a through FIG. 10c are diagrams describing Example 2 in a fabrication process of a thin film transistor according to an embodiment of the present invention.

Next, after removing the insulating layer 49, as shown in FIG. 10a, an $n^+$ impurity is added to the p-Si layer 45 to be a source area or a drain area under the condition in which accelerating voltage is equal to 10 to 30 keV and a dose amount is equal to $5 \times 10^{14}$ to $1 \times 10^{15}$ ions/cm$^2$ according to an RF discharge-type or a DC discharge-type plasma doping method and using $PH_3$. At the time of doping, since an area to be a channel on the p-Si layer 45 is shielded by the first insulating layer 10, impurity does not enter the channel area. Then, a semiconductor impurity layer is activated by the eximer laser beam 43 or the light from an infrared lamp and a low resistance area 46 having a sheet resistance equal to 1 to 5 k$\Omega$/□ is formed. It will be noted that a p-type impurity of $B_2H_6$ is used when forming a p-type thin film transistor.

Figure 10B:
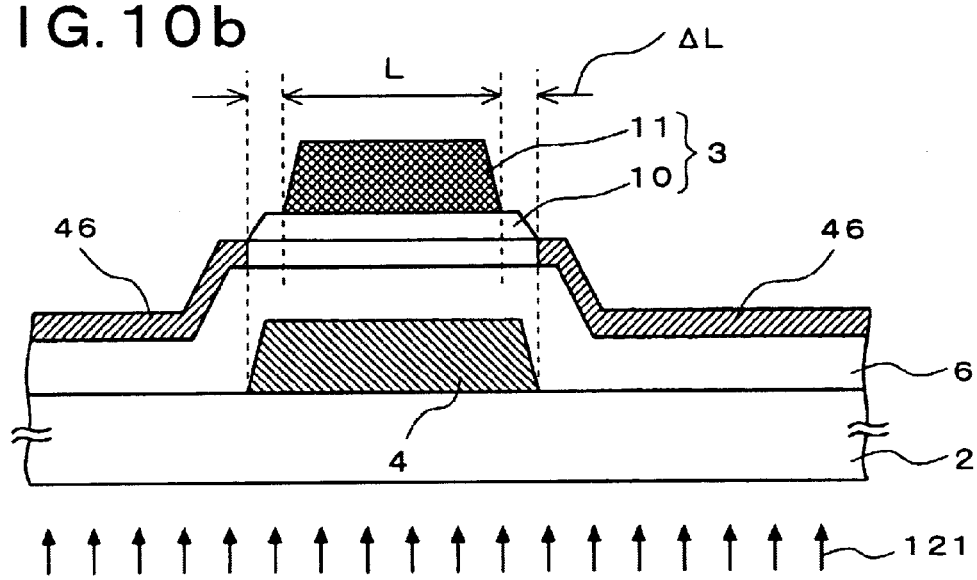

Then, as shown in FIG. 10b, a positive-type photoresist equal to 1.0 to 2.5 μm in thickness, preferably equal to 1.5 μm, is coated on a whole surface, and after the pre-bake process, the second insulating layer pattern is formed by combining the second back exposure and the second front exposure. A residual resist area is self-aligningly obtained along the gate electrode 4 by a back exposure 121, and then the photoresist other than the desired area along the gate electrode 4 is removed by the photolithography process from the front, and the second insulating layer 11 is formed. The photosensitive organic film (polyimide, acrylic, etc.) can also be used instead of the resist.

The retreating amount of the resist due to the wraparounding light becomes greater than that in the first exposure by making a second exposure energy E2 greater than a first exposure energy E1. Thus, the LDD area (width ΔL) where the resist does not exist is formed on the first insulating film 10. Usually, in order to ensure the reliability of the thin film transistor, the width of the LDD area is established in a range between approximately 0.5 and 1.5 μm. However, in this example, the width of the LDD area is established to be ΔL=1.0 μm. The width ΔL of the LDD area can be controlled to some extent by adjusting the exposure energy.

Figure 10C:
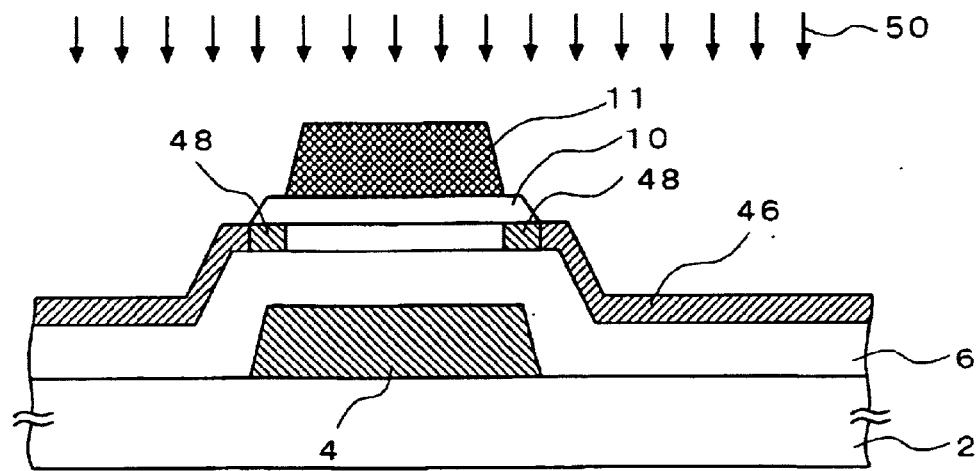

Next, as shown in FIG. 10c, an $n^-$ impurity 50 is added to the ΔL area under the condition in which the accelerating voltage is equal to 70 to 100 keV, the dose amount is equal to $1 \times 10^{12}$ to $1 \times 10^{14}$ ions/cm$^2$, preferably equal to $5 \times 10^{12}$ to $1 \times 10^{13}$ ions/cm$^2$ according to the RF discharge-type or the DC discharge-type plasma doping method and using $PH_3$. Since the channel area is shielded by the second insulating layer 11 and the first insulating layer 10, impurity 50 is not added. Hence, an LDD area 48 of the $n^-$ semiconductor layer is formed on both sides of the top surface of the channel area. Then, the first insulating layer 11 in which impurity is added is cured by the baking treatment at 200 to 300° C. Since the dose amount of the impurity is small in the LDD area 48, a high resistance area in which sheet resistance is equal to $5 \times 10^4$ to $5 \times 10^5$ Ω/□ is formed by performing the heat anneal (curing process, etc.) instead of the laser activation. It will be noted that the p-type impurity of $B_2H_6$ is used in case of the p-type thin film transistor.

Figure 11A:
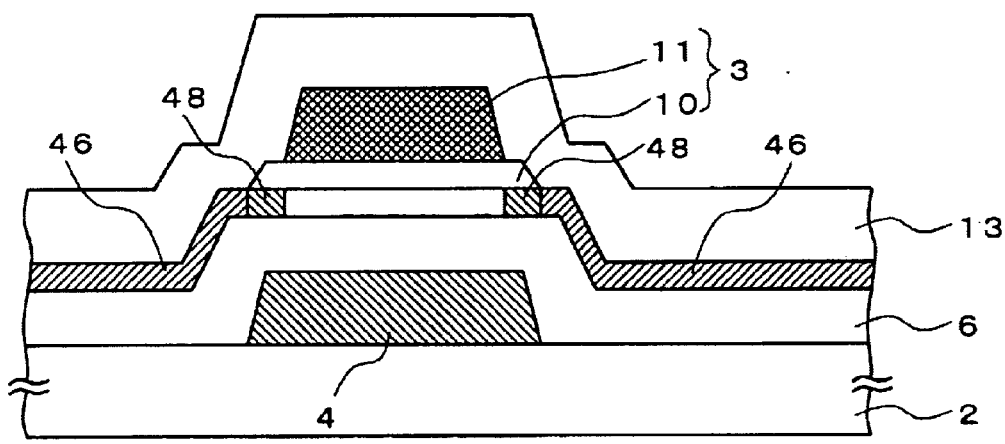
FIG. 11a through FIG. 11c are diagrams describing Example 2 in a fabrication process of a thin film transistor according to an embodiment of the present invention.

Next, as shown in FIG. 11a, a Ti/Al-Si/Ti layer (film thickness 100/200/100 nm) 13 is formed for forming the source and drain electrode layer by sputtering.

Figure 11B:
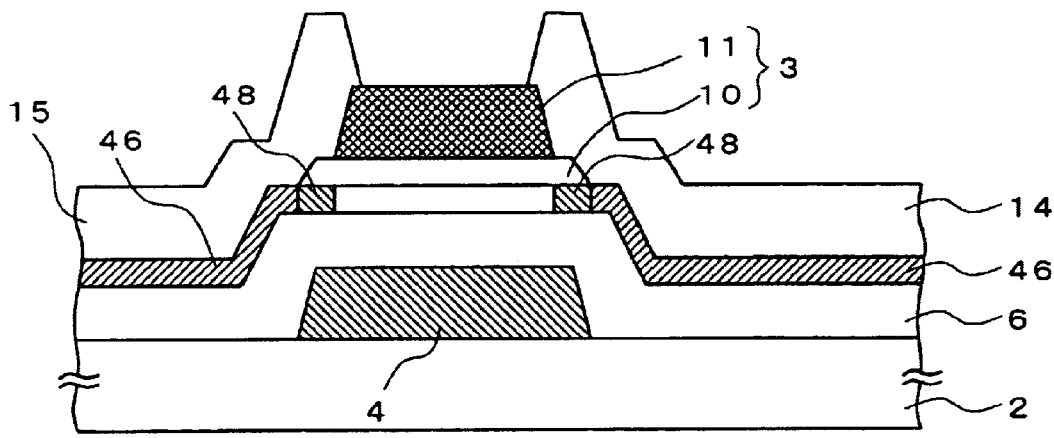

Then, as shown in FIG. 11b, the Ti/Al-Si/Ti layer 13 is etched and the source electrode 14 and the drain electrode 15 are formed by the RIE using chlorine-type gas. At this time, the second insulating layer 11 which is the resist film functions as an etching stopper.

Figure 11C:
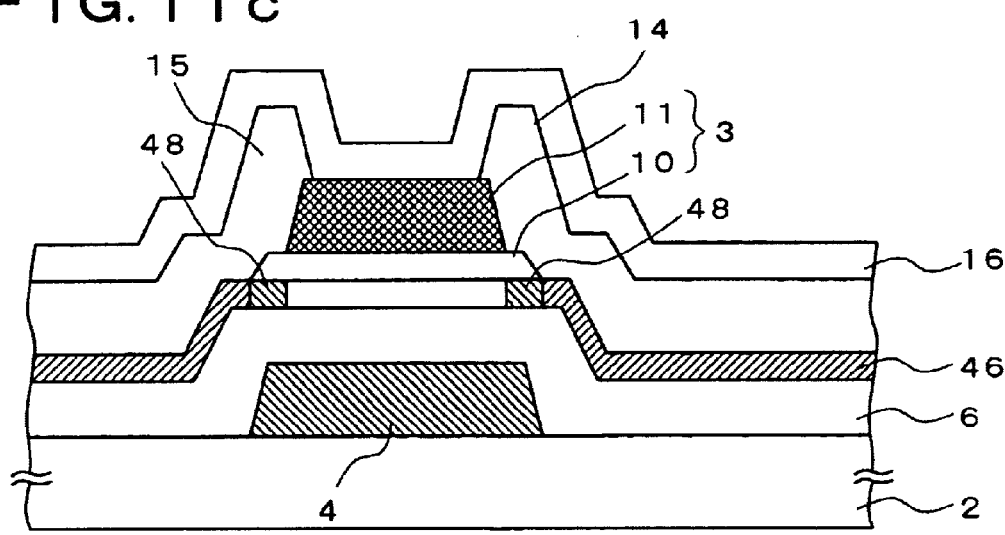

Next, as shown in FIG. 11c, the $SiN_x$ interlayer insulating film 16 equal to 100 to 500 nm, preferably equal to approximately 300 nm, is deposited by the PECVD method.

Figure 12A:
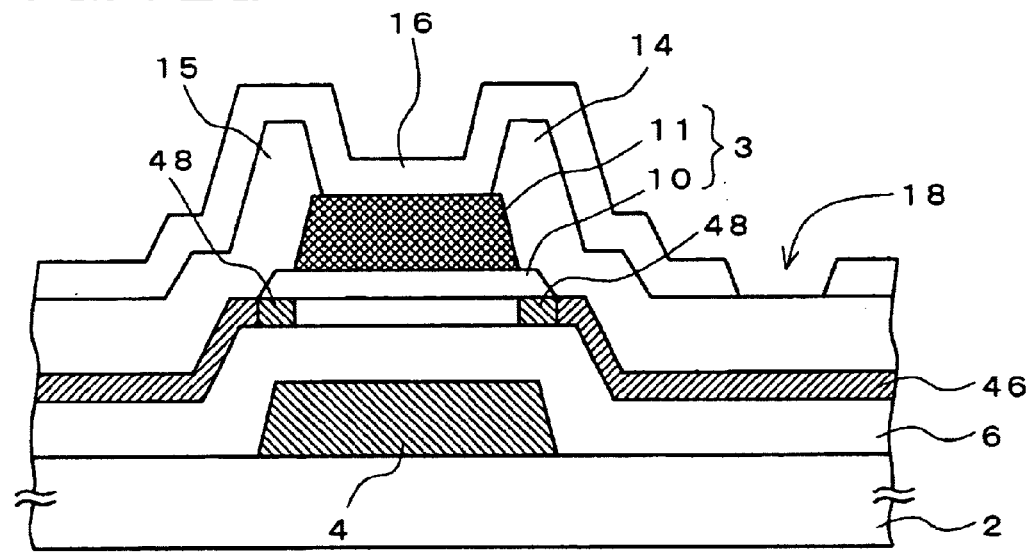
FIG. 12a and FIG. 12b are diagrams describing Example 2 in a fabrication process of a thin film transistor according to an embodiment of the present invention.

Next, as shown in FIG. 12a, the contact hole 18 is formed on the interlayer insulating film 16 on the source electrode 14 by the usual photolithography process and the RIE process.

Figure 12B:
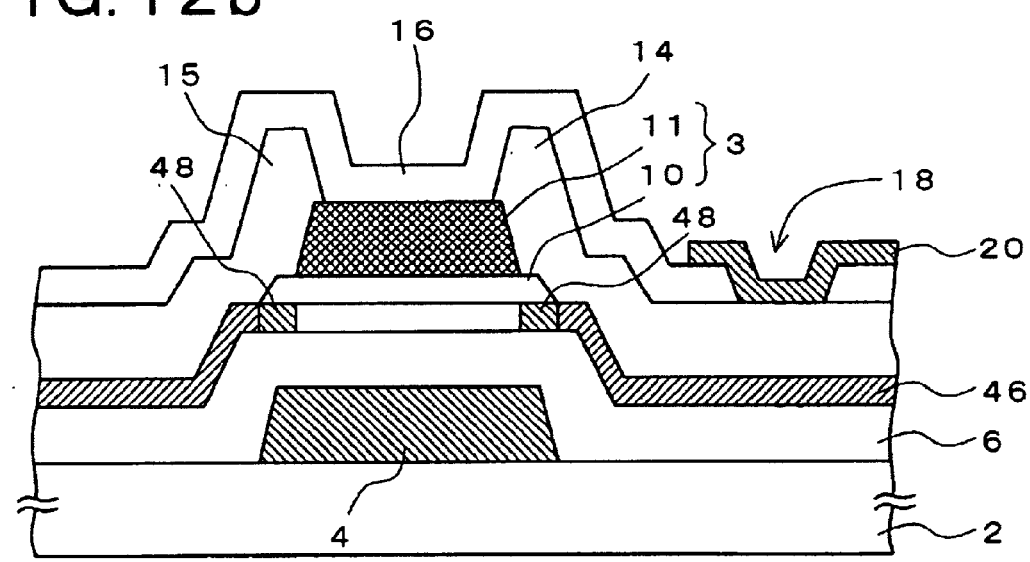

Next, as shown in FIG. 12b, the ITO (indium tin oxide) film which is the transparent electrode is developed from 50 to 100 nm in thickness, preferably to approximately 70 nm, by sputtering. Then, the pixel electrode 20 is formed by patterning the ITO film by the usual photolithography process and the wet etching process. Then, the anneal treatment is performed for 60 minutes in the $N_2$ environment of 200 to 300° C. and a fabrication process of the p-SiTFT substrate having an LDD structure is completed.

Thus, a thin film transistor having the LDD structure in which the channel protection film 3 composed of the first and the second insulating layers 10 and 11 is formed can be formed through the second back exposure. Similarly to Example 1, a particularly high reliability can be realized by using the thin film transistor as a switching element in the pixel area of a liquid crystal display since the thin film transistor having the p-Si film according to this example in the operational semiconductor layer can suppress the generation of the field-through voltage and the like due to the parasitic capacitance to the utmost.

Figure 13:
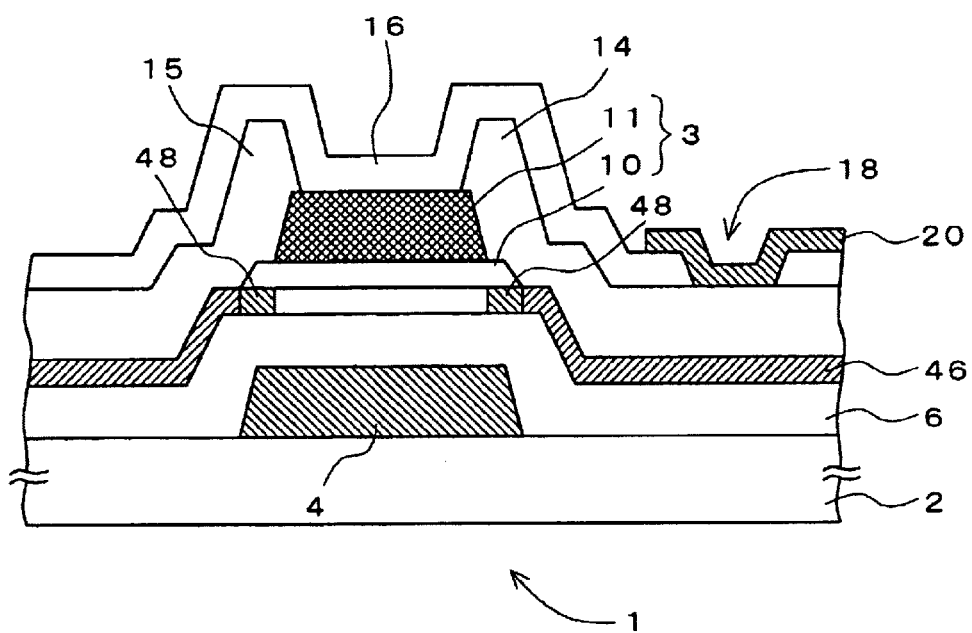
FIG. 13 is a diagram describing Example 2 for a liquid crystal display according to an embodiment of the present invention.

Next, an example of a variation of the liquid crystal display shown in this Example 2 is described with reference to FIG. 13. It will be noted that the same structuring elements as in the Example 2 are referred by the same codes and the descriptions are omitted. While, in Example 2, the second insulating layer 11 of the organic upper-layer insulating film is formed on the first insulating layer 10 of $SiN_x$, the liquid crystal display according to this variation example has a distinctive characteristic in forming the second insulating layer 11 using the $SiO_2$ film as an inorganic upper-layer insulating film instead of the organic upper-layer insulating film.

Since the relative dielectric constant of the $SiO_2$ film is as low as 3.8 to 4.2 in comparison with the relative dielectric constant of 7 to 9 of the $SiN_x$ film, the thick $SiO_2$ film (film thickness of approximately 1.0 to 1.5 μm) of the inorganic upper-layer insulating film can be used instead of the organic upper-layer insulating film. In the fabrication process of the liquid crystal display according to this variation example, the channel protection film 3 having the two-layer structure can be formed by sequentially depositing $SiN_x$ and $SiO_2$ films by the PECVD method, and the fabrication process can be simplified. Although an illustration is omitted, after the resist pattern is formed on the channel in the photolithography process combining the back exposure and the front exposure, an undesirable $SiO_2$ film is removed by the wet-etching and then an undesirable $SiN_x$ film is removed by the dry-etching. After the resist is peeled, the $n^+$ semiconductor film is deposited and then a metal layer for forming the source electrode and the drain electrode is formed. Since subsequent fabrication processes are the same as the processes after FIG. 11a in Example 2, the descriptions are omitted. It will be noted that forming the channel protection film by the two-layer inorganic insulation substance is not limited to the PECVD method. For example, the heat CVD method, sputtering or SOG can certainly be used. Further, similarly to the variation example described with reference to FIG. 8 in Example 1, although the channel protection film can be structured, in theory, only by the thick $SiO_2$ film instead of the $SiN_x$ and $SiO_2$ films having the two-layer structure, when conditions such as the adhesiveness with the bedding p-Si, sequential depositions of p-Si by the PECVD method and the like are considered, structuring a channel protection film only by the thick $SiO_2$ film generates various difficulties and is not practical.

EXAMPLE 3

Example 3 is an example applying this embodiment to a CMOS-type thin film polysilicon transistor (p-SiTFT) and a liquid crystal display having an integrated peripheral circuit which uses the CMOS-type thin film polysilicon transistor (p-SiTFT). First, a fabrication process of this thin film transistor is described with reference to FIG. 14a through FIG. 16c.

Figure 14A:
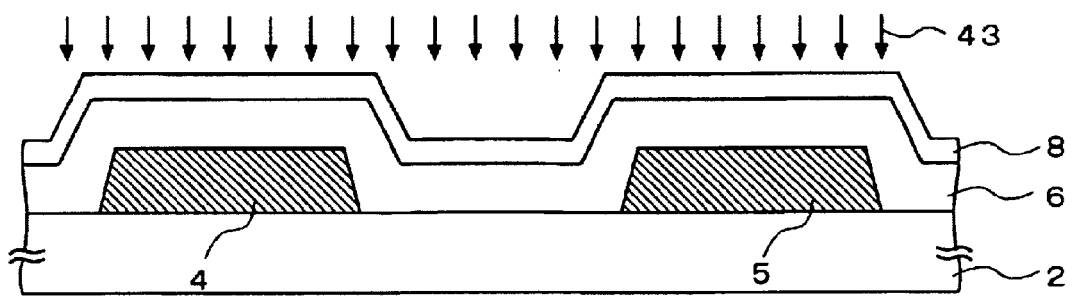
FIG. 14a through FIG. 14d are diagrams describing Example 3 in a fabrication process of this thin film transistor according to an embodiment of the present invention.

As shown in FIG. 14a, a glass substrate 2 by for example Corning Corporation #1737 is used as the insulative substrate. A Cr thin film is deposited on the glass substrate 2 by sputtering until the film thickness is equal to 100 to 300 nm, preferably equal to 150 nm. It will be noted that Ta, Mo, Al alloy or the like can also be used instead of Cr. Next, the gate electrodes 4 and 5 are formed by coating the resist on a whole surface by the usual photolithography process, patterning the resist, etching the Cr thin film by the wet-etching using the resist pattern as a mask. Then, using the PECVD method, for example, an SiNx film is deposited from 200 to 500 nm in thickness, preferably to approximately 350 nm, and the gate insulating film 6 is formed. By continuously using the PECVD method, an a-Si:H film 8 equal to 20 to 100 nm in thickness, preferably equal to approximately 40 to 50 nm is formed for forming an operational semiconductor film. Then, a hydrogen removing process in which hydrogen is discharged from the a-Si film 8 is performed by performing the anneal treatment for approximately one hour in the $N_2$ environment of 450° C. Then, the a-Si film 8 is altered to a polysilicon (p-Si) film 45 by irradiating an eximer laser. beam 43 having a wavelength equal to 308 nm and an energy density equal to 300 to 400 $mJ/cm^2$, preferably equal to 320 to 350 $mJ/cm^2$, to the a-Si film 8. It will be noted that the above anneal process is not required when an a-Si film having low hydrogen density is used.

Figure 14B:
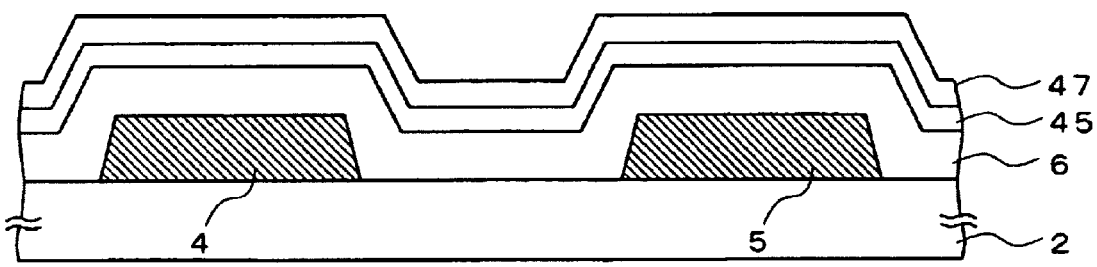

Next, as shown in FIG. 14b, an insulating film 47 which is, for example, an $SiN_x$ film formed to be equal to 100 to 200 nm in thickness, preferably equal to 150 nm, is deposited in order to form the first insulating layer 10 to be the first layer of the channel protection film.

Figure 14C:
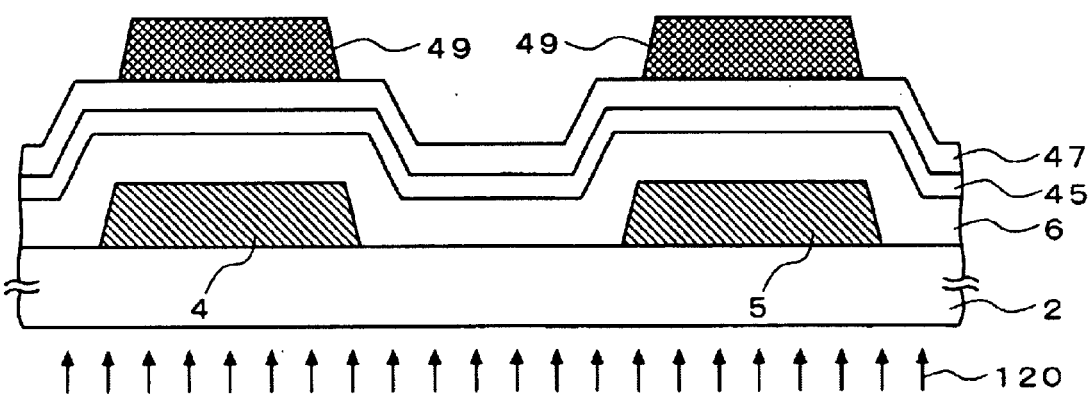

Next, as shown in FIG. 14c, a positive-type photoresist 49 equal to 1.0 to 2.5 μm in thickness, preferably equal to 1.5 μm, is coated on a whole surface, and after the pre-bake process, an insulating layer pattern 49 is formed by combining a back exposure (exposure energy E1) and a front exposure. By the back exposure 120, a residual resist area is self-aligningly obtained along the gate electrodes 4 and 5, and then photoresist other than the desired area along the gate electrodes 4 and 5 are removed by the photolithography process from the front, and an insulating layer 49 is formed. Instead of the resist, a photosensitive organic film (polyimide, acrylic, and the like) can also be used.

Figure 14D:
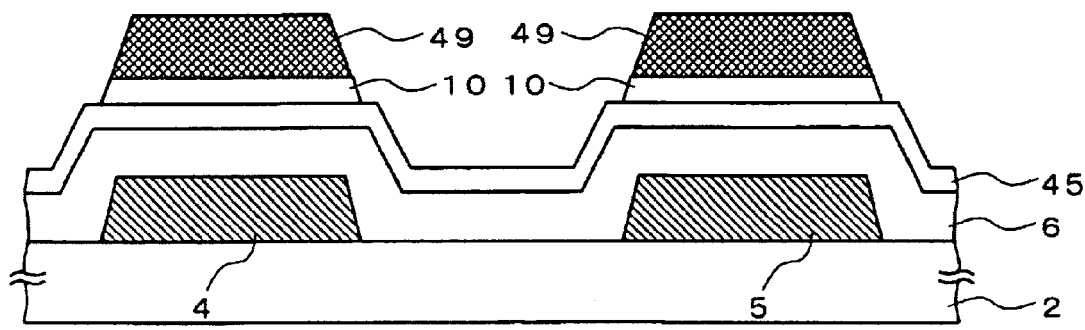

Then, as shown in FIG. 14d, the post-bake is performed at the temperature of 150 to 250°, preferably approximately 180° C., the $SiN_x$ insulating film 47 on the p-Si film 45 is selectively dry-etched by the RIE using the insulating layer 49 as a mask, and the first insulating layer 10 is formed.

Figure 15A:
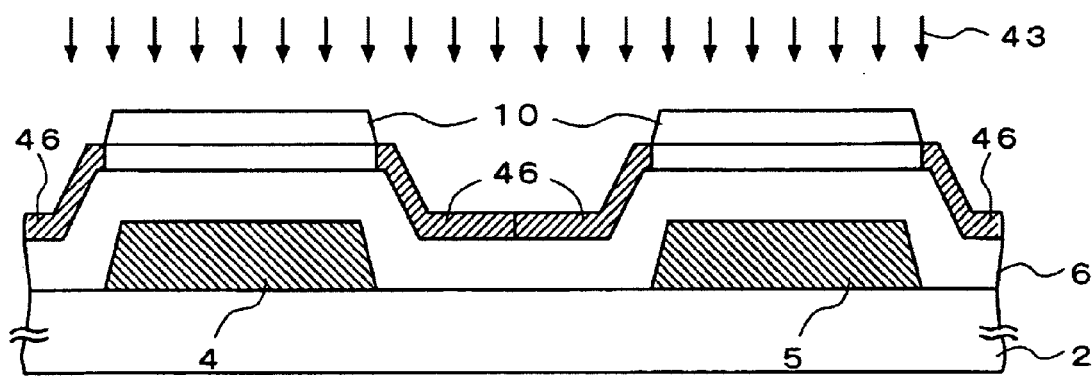
FIG. 15a through FIG. 15c are diagrams describing Example 3 in a fabrication process of this thin film transistor according to an embodiment of the present invention.

Next, an $n^+$ impurity is added to the p-Si layer 45 to be a source area or a drain area of a n-type TFT and a p-type TFT under the condition in which the accelerating voltage is equal to 10 to 30 keV and a dose amount is equal to $5 \times 10^{14}$ to $1 \times 10^{15}$ $ions/cm^2$ after removing the insulating layer 49, as shown in FIG. 15a, according to an RF discharge-type or a DC discharge-type plasma doping method and using $PH_3$. At the time of doping, since an area to be a channel on the p-Si layer 45 is shielded by the first insulating layer 10, impurity does not enter the channel area. Then, a semiconductor impurity layer is activated by the eximer laser beam 43 or the light from the infrared lamp and the low resistance area 46 having a sheet resistance equal to 1 to 5 kΩ/□ is formed.

Figure 15B:
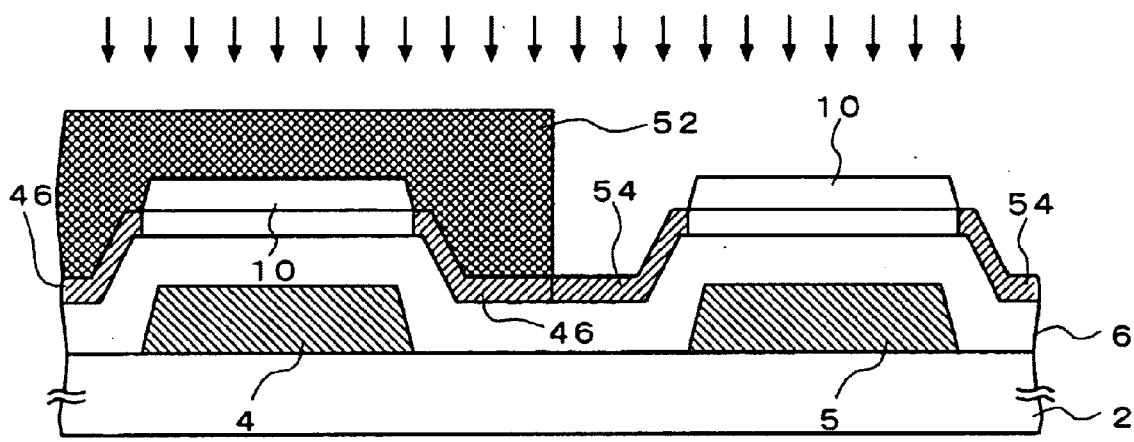

Next, as shown in FIG. 15b, a resist layer 52 is left on the n-type TFT area and the p-type TFT area is exposed by patterning after coating the resist on a whole surface. A $p^+$ impurity is added to the p-type TFT source and drain areas under the condition in which accelerating voltage is equal to 10 to 31 keV and a dose amount is equal to $1 \times 10^{14}$ to $5 \times 10^{15}$ $ions/cm^2$ and a $p^+$-type semiconductor layer 54 in the p-type TFT forming area according to the RF discharge-type or the DC discharge-type plasma doping method and using $B_2H_6$. Since an n-type impurity such as P (phosphorus) and the like is first doped on a whole substrate surface and then B (boron) is doped only in the p-type TFT forming area, the method of forming the $p^+$ area is called an inversion dope. Usually, a dose amount for the inversion dope is two or three times more than that of a whole surface dope.

Figure 15C:
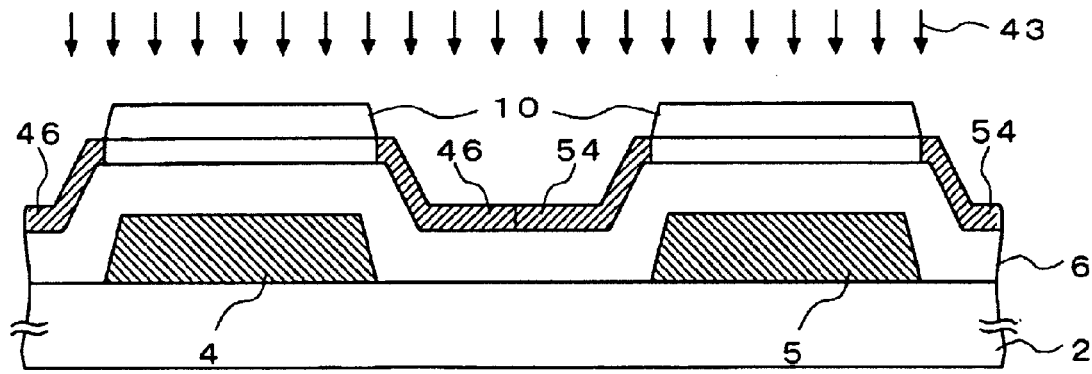

Then, as shown in FIG. 15c, the resist layer 52 is removed, the impurity layer which includes doped P or B is activated by the eximer laser beam 43 or the light from an infrared lamp and a low resistance area having the sheet resistance equal to 1 to 5 kΩ/□ is formed.

Figure 16A:
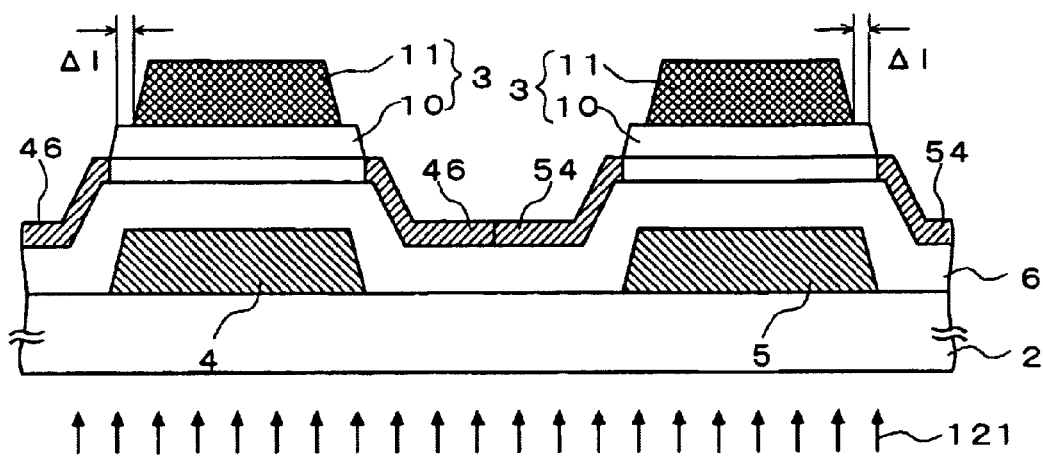
FIG. 16a through FIG. 16c are diagrams describing Example 3 in a fabrication process of this thin film transistor according to an embodiment of the present invention.

Next, as shown in FIG. 16a, a positive-type photoresist equal to 1.0 to 2.5 μm in thickness, preferably equal to 1.5 μm, is coated on a whole surface, and after the pre-bake process, the second insulating layer pattern is formed by combining the second back exposure and the second front exposure. A residual resist area is self-aligningly obtained along the gate electrodes 4 and 5 by a back exposure 121, and then the photoresist other than the desired area along the gate electrodes 4 and 5 is removed by the photolithography process from the front, and the second insulating layer 11 is formed. Instead of the resist, the photosensitive organic film (polyimide, acrylic, etc.) can also be used.

In this example, an offset area Δ1 having a high resistance is formed in the n-type and the p-type TFT in order to simplify the process. The width of the offset area Δ1 can be controlled within the range between 0.5 and 1.0 μm by adjusting the exposure energy E2.

Next, the Ti/Al-Si/Ti layer (film thickness 100/200/100 nm) 13 is formed as a multi-layer metal layer for forming the source and drain electrode layer by sputtering.

Figure 16B:
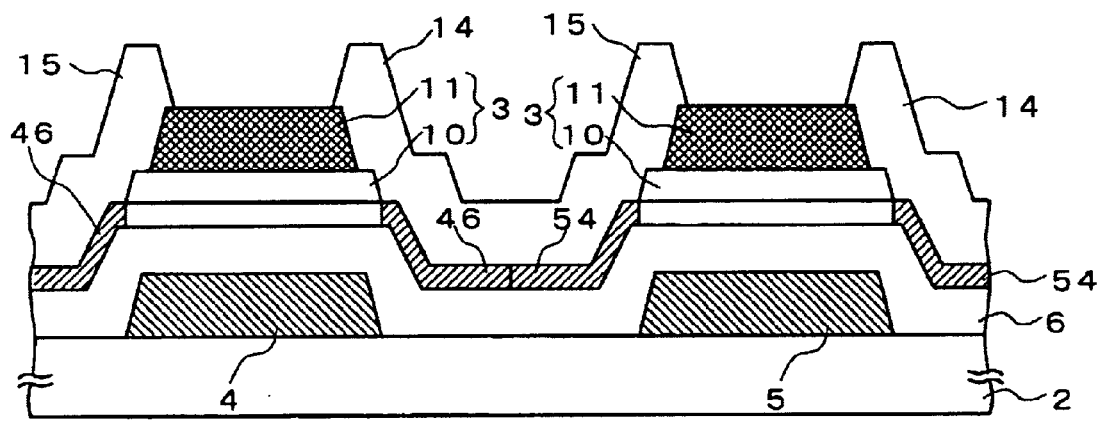

Then as shown in FIG. 16b, the source electrode 14 and the drain electrode 15 are formed by etching the Ti/Al-Si/Ti layer 13 by the RIE using chlorine-type gas. At this time, the second insulating layer 11 which is the resist film functions as the etching stopper.

Figure 16C:
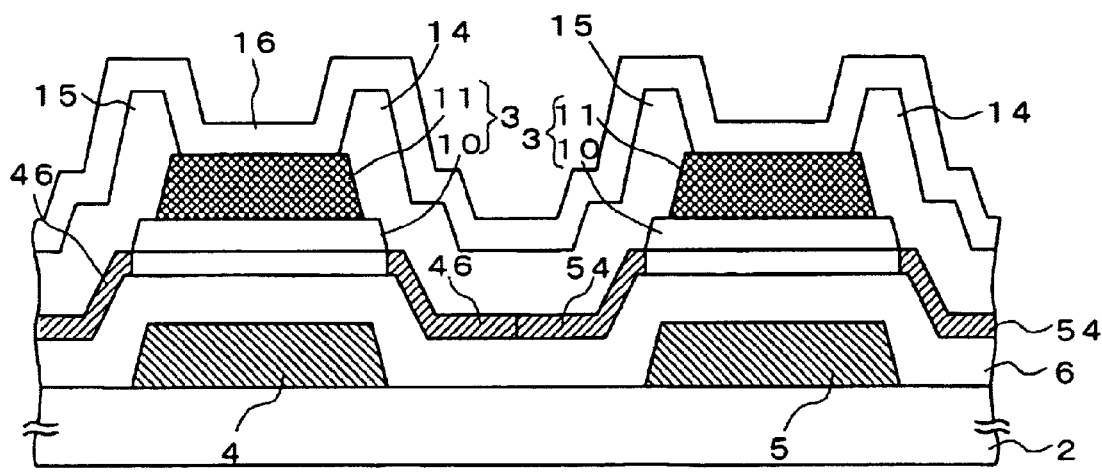

Next, as shown in FIG. 16c, the $SiN_x$ interlayer insulating film 16 equal to 100 to 500 nm, preferably equal to approximately 300 nm, is deposited by the PECVD method and a CMOS-type p-SiTFT which is a peripheral device driving circuit used in a liquid crystal display is completed.

Although an illustration is omitted, similarly to FIG. 12a and FIG. 12b of Example 2, the contact hole is formed on the interlayer insulating film 16 on the source electrode of the thin film transistor in the pixel area by the usual photolithography process and the RIE process. The ITO film which is the transparent electrode is developed from 50 to 100 nm in thickness, preferably to approximately 70 nm, by sputtering. Then, the ITO film is patterned by the usual photolithography process and the wet etching process, and the pixel electrode is formed. Then, the anneal treatment is performed for 60 minutes in the $N_2$ environment of 200 to 300° C. and the fabrication process of the p-SiTFT substrate is completed.

Thus, the CMOS-type p-SiTFT in which the channel protection film 3 composed of the first and the second insulating layers 10 and 11 is formed can be formed through the second back exposure. Similarly to Example 1 and 2, since the CMOS-type p-SiTFT having the p-Si film according to this example in the operational semiconductor layer can suppress the generation of the parasitic capacitance to the utmost, the CMOS-type p-SiTFT can realize a particularly high reliability as a switching element used in a peripheral device driving circuit in the liquid crystal display having the integrated peripheral circuit.

Next, a liquid crystal display mounting a CMOS-type p-SiTFT according to this example on a peripheral device driving circuit is described with reference to FIG. 17 through FIG. 20.

Figure 17:
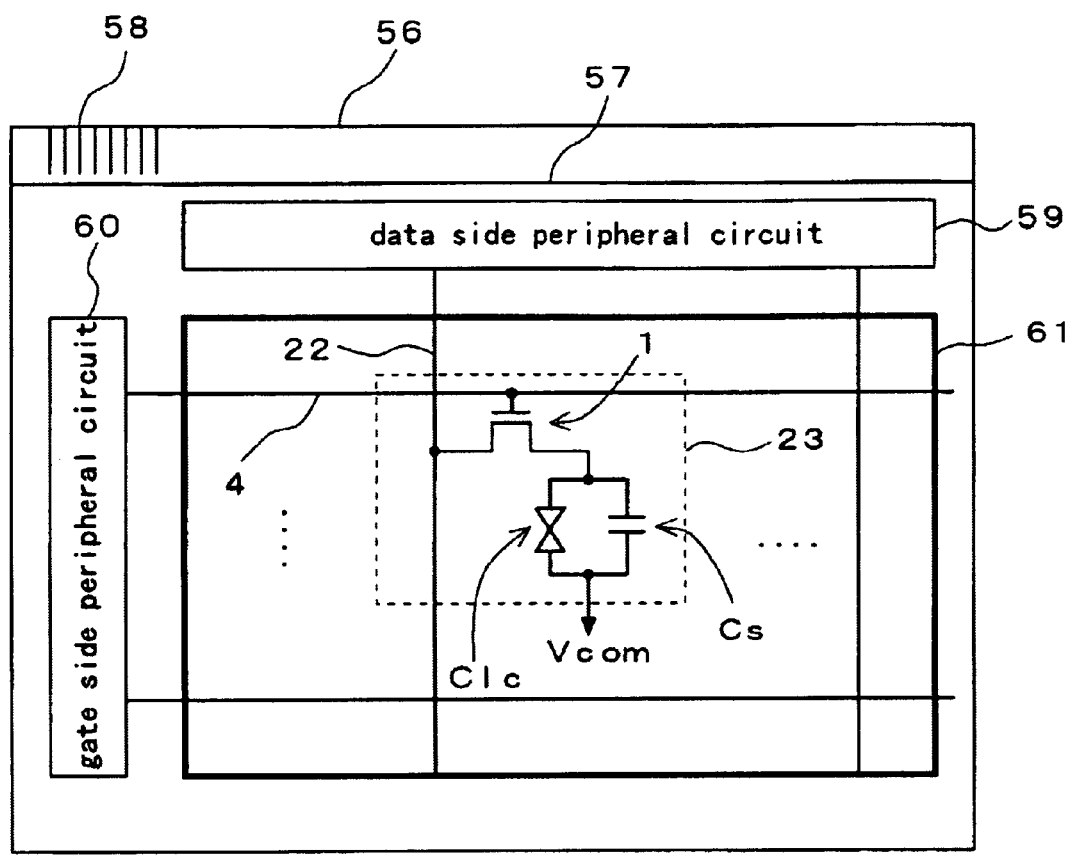
FIG. 17 is a diagram showing a schematic structure of a peripheral device driving circuit according to an embodiment of the present invention and a liquid crystal display provided therewith.

FIG. 17 shows a schematic structure of the peripheral device driving circuit according to this example and a liquid crystal display therewith. A display area 61 where the plurality of pixel areas 23 having the thin film transistor 1 and a display electrode are arranged in a matrix shape is decided on an array substrate 56. In the periphery of the display area 61, a peripheral circuit formed by a low-temperature polysilicon process is arranged. A gate side peripheral circuit 60 is arranged in the left part of the diagram, and a data side peripheral circuit 59 is arranged in the upper part of the diagram. Further, an input terminal 58 is provided in the upper part of the panel in the diagram wherein a dot clock, horizontal synchronous signal (Hsync), vertical synchronous signal (Vsync) and RGB data from a system side is inputted to the input terminal 58. The array substrate 56 is facing and attached to an opposite substrate 57 via a sealing material which is not shown in the diagram. Liquid crystal is sealed in the cell gap between the array substrate 56 and the opposite substrate 57.

Inside the display area 61, the plurality of data wirings 22 extending in a vertical direction in the diagram are formed in parallel to the horizontal direction in the diagram. Each of the plurality of data wirings 22 is driven by a data driver in the gate side peripheral circuit 60.

Further, the plurality of gate wirings 4 extending substantially in the orthogonal direction to the data wirings 22 are formed in parallel to the vertical direction in the diagram. Each of the plurality of gate wirings 4 is driven by a gate driver in the gate side peripheral circuit 60.

Figure 18:
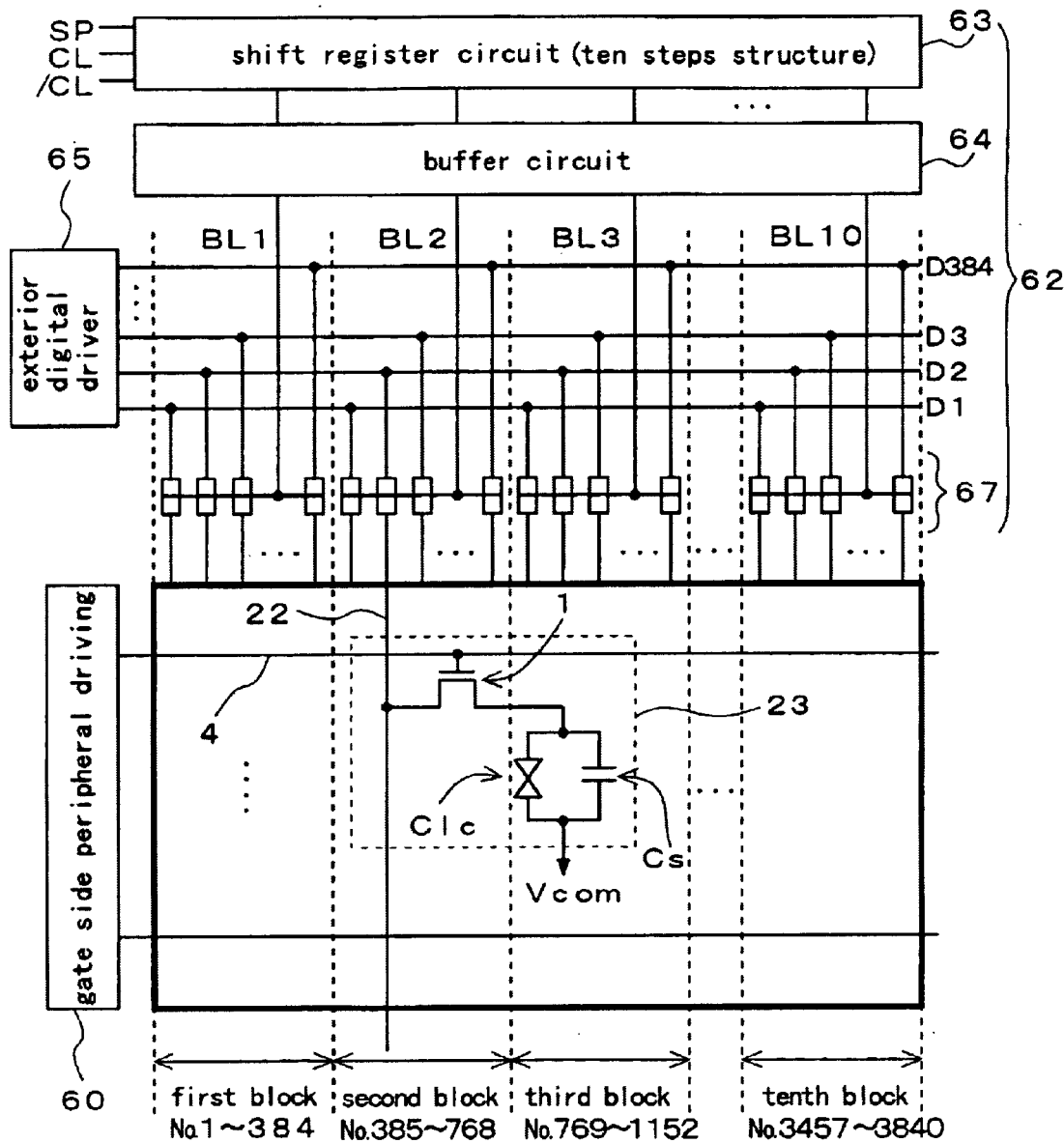
FIG. 18 is a diagram describing a sequential block driving in a peripheral device driving circuit according to an embodiment of the present invention.

FIG. 18 shows the data driver of the liquid crystal display shown in FIG. 17 in detail. In FIG. 18, the structuring elements having the same functional operations as the structuring elements described with reference to FIG. 17 are referred by the same codes and the descriptions are omitted. A data driver 62 having a sequential block driving method is provided in the data side peripheral circuit 59 shown in FIG. 17.

For example, in case of a color display which is a matrix display panel of an SXGA with 1280 horizontal pixels and 768 vertical pixels in which a pixel is composed of three subpixels of red (R), green (G) and blue(B), the number of display subpixels on a single gate signal line (scanning line) is equal to 3840 (=1280×3). The case in which the SXGA liquid crystal display panel having the number of subpixels equal to 3840 in a direction of the gate wiring is sequentially driven for each block by an externally installed digital driver LSI 65 having 384 output terminals D1 through D384 is described below. In the sequential block driving method, the whole data wirings are divided to be included in any of the 10 blocks from a block BL1 to BL10.

The digital driver LSI 65 simultaneously outputs gray scale signals to the 384 data wirings included in the block BL1, then simultaneously outputs the gray scale signals to the 384 data wirings included in the block BL2, and similarly outputs the gray scale signals sequentially for a block unit until the block BL10 is reached. A series of these operations are completed within a horizontal scanning period.

The data driver 62 has the shift resistor which generates a sampling pulse. The shift resistor 63 is structured by 10 steps in this application and sequentially supplies the sampling pulse to a CMOS-type TFT analog switch portion 67 from the step 01 through the step 10 via a buffer circuit 64. The CMOS-type TFT analog switch portion 67 is independently provided in each block, and the CMOS-type TFT of this example is connected as a switching element of each data wiring connected to each of the data wirings D1 through D384 of the driver LSI 65.

Figure 19A:
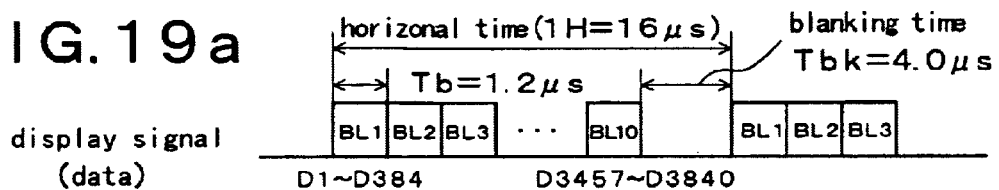
FIG. 19a through FIG. 19f are diagrams showing timing charts of a sequential block driving in a peripheral device driving circuit according to an embodiment of the present invention.
Figure 19B:
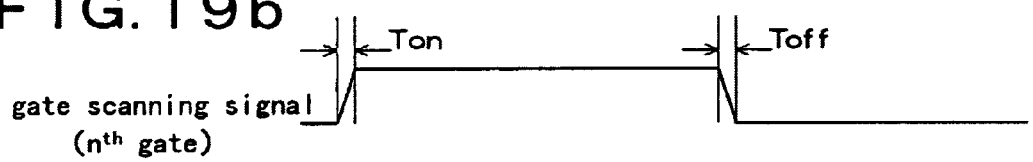
Figure 19C:
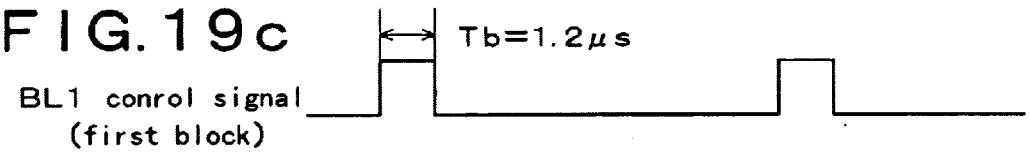
Figure 19D:
Figure 19E:
Figure 19F:

When the gray scale data for a predetermined block is outputted from the digital driver LSI 65 to the data wirings D1 through D384 and the sampling pulse is supplied to a CMOS-type TFT gate electrode corresponding, to the predetermined block of the CMOS-type TFT analog switch portion 67, the gray scale data is outputted to each data wiring of the block. FIG. 19a through FIG. 19f show a timing chart of a driving signal and data wiring. FIG. 19a shows that the gray scale data for 10 blocks from the block BL1 to BL10 is outputted within a horizontal scanning period. FIG. 19b shows a "ON" state of a gate pulse on the $n^{th}$ gate wiring. FIG. 19c through 19f show a state of the sampling pulses (block controlling signals) to be outputted to the block BL1 through BL10. A horizontal scanning period is equal to 1H=16 μsec, a write time per a block is equal to Tb=1.2 μsec and a horizontal blanking time is equal to Tbk=4.0 μsec. By dividing the gray scale data (1280×3 (each color of R, G, B)=3840) of a horizontal line into 10 blocks from BL1 through BL10 having 384 subpixels (R, G, B pixels), ON/OFF of the CMOS-type TFT analog switch in each block can be controlled and writing can be sequentially performed for each block. Since write time is relatively longer than that of a sequential point method, the writing is possible if a traveling degree of a TFT in the pixel area is more than 20 $cm^2/Vs$.

Figure 20:
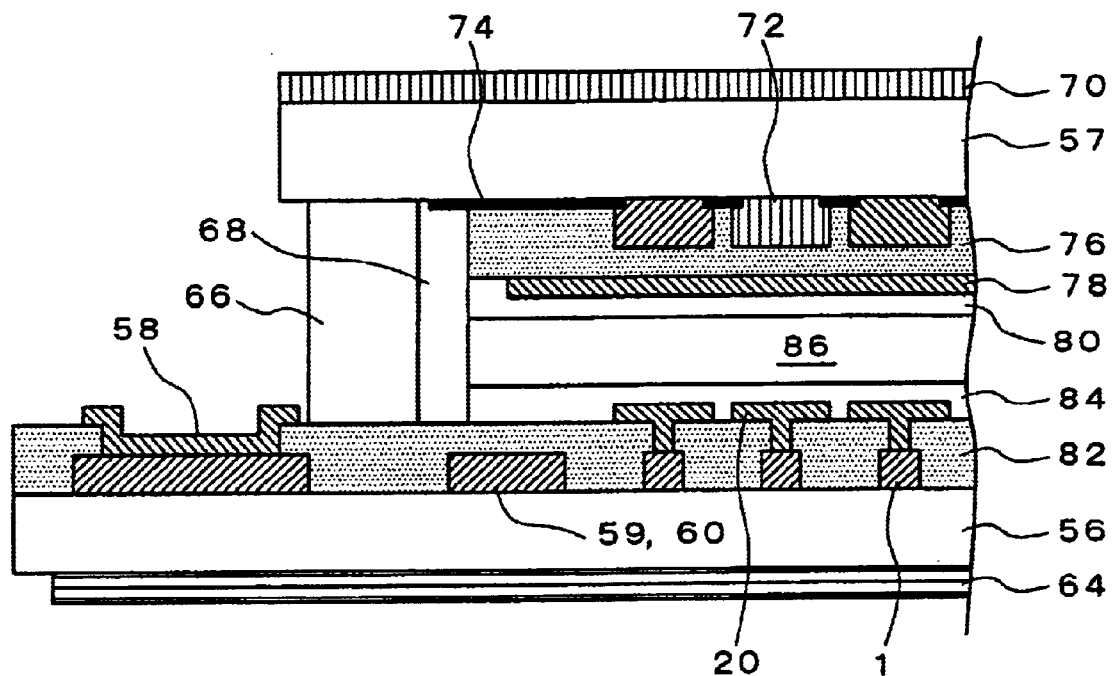
FIG. 20 is a diagram showing a partial cross section of a peripheral device driving circuit according to an embodiment of the present invention and a liquid crystal display provided therewith.
Figure 21:
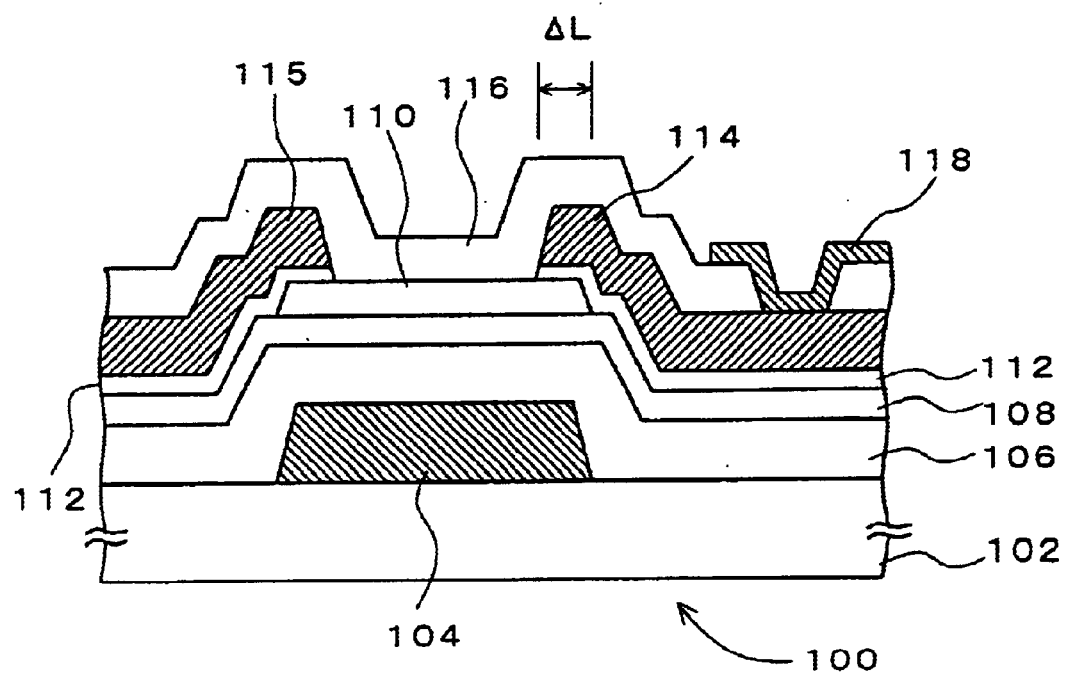
FIG. 21 is a diagram showing a cross section structure of the conventional bottom-gate-type thin film transistor.

FIG. 20 shows a partial cross section of a liquid crystal display according to this example. on the array substrate 56, peripheral circuits 59 and 60 and the TFT 1 for display for a pixel area which are formed by being embedded in a planarized film 82. A plurality of display electrodes 20 are formed on the planarized film 82, and an alignment film 84 is formed thereon. On the opposite side of a pixel forming side of the array substrate 56, a polarizing plate 64 directing the light irradiated from a light leading plate which not shown to a predetermined polarizing direction is attached. The opposite substrate 57 is attached to the array substrate 56 via a sealing material 77, facing each other at a predetermined cell gap. Further, the array substrate 56 and the opposite substrate 57 are electrically connected by a transfer 68. Liquid crystal 86 is sealed in an area between the array substrate 56 and the opposite substrate 57.

A shading film (black matrix; BM) 74 shading an area which does not contribute to display is formed on the side of the opposite substrate 57 facing the liquid crystal 86. Color filters 72 for R, G and B are respectively formed in each predetermined position in opening areas without the shading film 74. On a planarized film 76 embedding these color filters, an opposite electrode 78 using, for example, the ITO is formed and an alignment film 80 is formed thereon. Further, on an area other than the display area on the array substrate 56, an extended terminal 58 for signal input and output with external systems is formed.

The present invention is not limited to the above embodiment and various variations are possible.

For example, although the channel protection film 10 having the two-layer structure is used as the example to describe in the above embodiment, the present invention is not limited to this and the channel protection film 10 may be formed in the multi-layer structure of more than three layers and similar operational effects to the case of two layers can be taken.

As described above, according to the present invention, the flickering of the display, a reduction in contrast and the like due to the parasitic capacitance Cp can be reduced, thereby realizing a liquid crystal display which can display superior high-quality pictures. Further, damages of the channel protection film during the process of forming the source are and the drain area can be reduced, thereby substantially improving the performance and long-term reliability of the thin film transistor and the liquid crystal display using the thin film transistor.

What is claimed is:

1. A bottom gate type thin film transistor comprising:

a gate electrode formed on a substrate;

a gate insulating film formed on the gate electrode;

an operational semiconductor film formed on the gate insulating film on the gate electrode;

a channel protection film formed on the operational semiconductor film;

a source electrode and a drain electrode formed, respectively, on each side of a top surface of the channel protection film and being connected to the operational semiconductor film; and the channel protection film including a first insulating layer that contacts an upper surface of the operational semiconductor film, and a second insulating layer formed on the first insulating layer;

wherein a dielectric constant of the second insulating layer is less than or equal to the dielectric constant of the first insulating layer;

a thickness of the first insulating layer is within the range of approximately 100–300 nm, and a thickness of the second insulating layer is greater than or equal to the thickness of the first insulating layer; and a width of the second insulating layer is less than a width of said first insulating layer, such that light doping drain (LDD) areas can be formed on the operational semiconductor film.

2. A thin film transistor comprising:

a gate electrode formed on a substrate;

a gate insulating film formed on the gate electrode;

an operational semiconductor film formed on the gate insulating film on the gate electrode;

a channel protection film formed on the operational semiconductor film;

a source electrode and a drain electrode formed, respectively, on each side of a top surface of the channel protection film and being connected to the operational semiconductor film; and the channel protection film including a first insulating layer that contacts an upper surface of the operational semiconductor film and a second insulating layer formed on the first insulating layer, wherein a dielectric constant of the second insulating layer is less than or equal to the dielectric constant of the first insulating layer;

a thickness of the first insulating layer is within the range of approximately 100–300 nm, and a thickness of the second insulating layer is greater than or equal to the thickness of the first insulating layer; and a width of the second insulating layer is less than a width of said first insulating layer, such that light doping drain (LDD) areas can be formed on the operational semiconductor film.

3. A method of fabricating a bottom gate type thin film transistor comprising:

forming a gate electrode on a substrate;

forming a gate insulating film on the gate electrode;

forming an operational semiconductor film on the gate insulating film on the gate electrode;

forming a channel protection film on the operational semiconductor film, wherein the channel protection film is formed by laminating a first insulating layer to contact an upper surface of the operational semiconductor film and by laminating a second insulating layer on the first insulating layer;

reducing the parasitic capacitance formed by the channel protection film by:

selecting materials for the first and second insulating layers such that said second insulating layer has a dielectric constant that is less than or equal to the dielectric constant of the first insulating layer;

selecting the thickness of the first insulating layer to be within the range of approximately 100–300 nm, and selecting the thickness of the second insulating layer to be is greater than or equal to the thickness of the first insulating layer;

forming a source electrode and a drain electrode on each side, respectively, of a top surface of the channel protection film, and connecting said source and drain electrodes to the operational semiconductor film; and making the second insulating layer of a narrower width than the first insulating layer and forming light doping drain (LDD) areas on the operational semiconductor film by using the second insulating layer as a shield.

4. An active matrix type liquid crystal display comprising:

a plurality of gate wirings formed on a substrate;

a plurality of data wirings arranged perpendicular to the gate wirings; and a thin film transistor formed for each of a plurality of pixel areas defined by the plurality of gate wirings and the plurality of data wirings, wherein the thin film transistor includes a gate electrode formed on a substrate, a gate insulating film formed on the gate electrode, an operational semiconductor film formed on the gate insulating film on the gate electrode, a channel protection film formed on the operational semiconductor film, and a source electrode and a drain electrode formed, respectively, on each side of a top surface of the channel protection film and being connected to the operational semiconductor film, and wherein the channel protection film includes a first insulating layer contacting an upper surface of the operational semiconductor film and a second insulating layer formed on the first insulating layer a dielectric constant of the second insulating layer is less than or equal to the dielectric constant of the first insulating layer;

a thickness of the first insulating layer is within the range of approximately 100–300 nm, and a thickness of the second insulating layer is greater than or equal to the thickness of the first insulating layer; and the second insulating layer is less than a width of the first insulating layer, such that light doping drain (LDD) areas can be formed on the operational semiconductor film.

5. A bottom gate type thin film transistor comprising:

a gate electrode formed on a substrate;

a gate insulating film formed on the gate electrode;

an operational semiconductor film formed on the gate insulating film on the gate electrode;

a channel protection film formed on the operational semiconductor film;

a source electrode and a drain electrode formed, respectively, on each side of a top surface of the channel protection film and being connected to the operational semiconductor film; and the channel protection film including a first insulating layer that contacts an upper surface of the operational semiconductor film and a second insulating layer formed on the first insulating layer;

wherein a thickness of the first insulating layer is within the range of approximately 100–300 nm, and a thickness of the second insulating layer is greater than or equal to the thickness of the first insulating layer; and a width of the second insulating layer is less than a width of the first insulating layer, such that light doping drain (LDD) areas can be formed on the operational semiconductor film.

* * * * *